United States Patent
Yoo et al.

(10) Patent No.: US 6,168,984 B1
(45) Date of Patent: Jan. 2, 2001

(54) REDUCTION OF THE ASPECT RATIO OF DEEP CONTACT HOLES FOR EMBEDDED DRAM DEVICES

(75) Inventors: Chue-San Yoo, Hsin-Chu; Ming-Hsiung Chiang, Taipei; Wen-Chuan Chiang, Hsin-Chu; Cheng-Ming Wu, Kao Hsiung; Tse-Liang Ying, Hsin-Chu, all of (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/419,103

(22) Filed: Oct. 15, 1999

(51) Int. Cl.⁷ ............................................... H01L 21/8242
(52) U.S. Cl. ..................... 438/239; 438/244; 438/253; 438/255
(58) Field of Search ................................. 438/239, 244, 438/253, 255, 238

(56) References Cited

U.S. PATENT DOCUMENTS

| | | | |
|---|---|---|---|
| 5,229,326 | 7/1993 | Dennison et al. | 437/195 |
| 5,700,706 | 12/1997 | Juengling | 437/52 |
| 5,705,427 | 1/1998 | Chan et al. | 437/192 |
| 5,716,881 | 2/1998 | Liang et al. | 438/238 |
| 5,801,096 | 9/1998 | Lee et al. | 438/636 |
| 6,037,216 | * 4/2000 | Liu et al. | 438/253 |
| 6,054,347 | * 4/2000 | Lin | 438/253 |

* cited by examiner

Primary Examiner—Trung Dang
(74) Attorney, Agent, or Firm—George O. Saile; Stephen B. Ackerman

(57) ABSTRACT

A process for reducing the aspect ratio, for narrow diameter contact holes, formed in thick insulator layers, used to integrate logic and DRAM memory devices, on the same semiconductor chip, has been developed. The process of reducing the aspect ratio, of these contact holes, features initially forming, via patterning procedures, lower, narrow diameter contact holes, to active device regions, in the logic area, while also forming self-aligned contact openings to source/drain regions in the DRAM memory region. After forming tungsten structures, in the lower, narrow diameter contact holes, polycide bitline, and polysilicon capacitor structures, are formed in the DRAM memory region, via deposition, and patterning, of upper level insulator layers, and polysilicon and polycide conductive layers. Upper, narrow diameter openings, are then formed in the upper level insulator layers, exposing the top surface of tungsten structures, located in the lower, narrow diameter contact holes. The formation of upper tungsten structures, in the upper, narrow diameter contact openings completes the process of forming metal structures, in narrow diameter openings, with reduced aspect ratios, achieved via a two stage contact hole opening, and a two stage metal filling procedure.

32 Claims, 19 Drawing Sheets

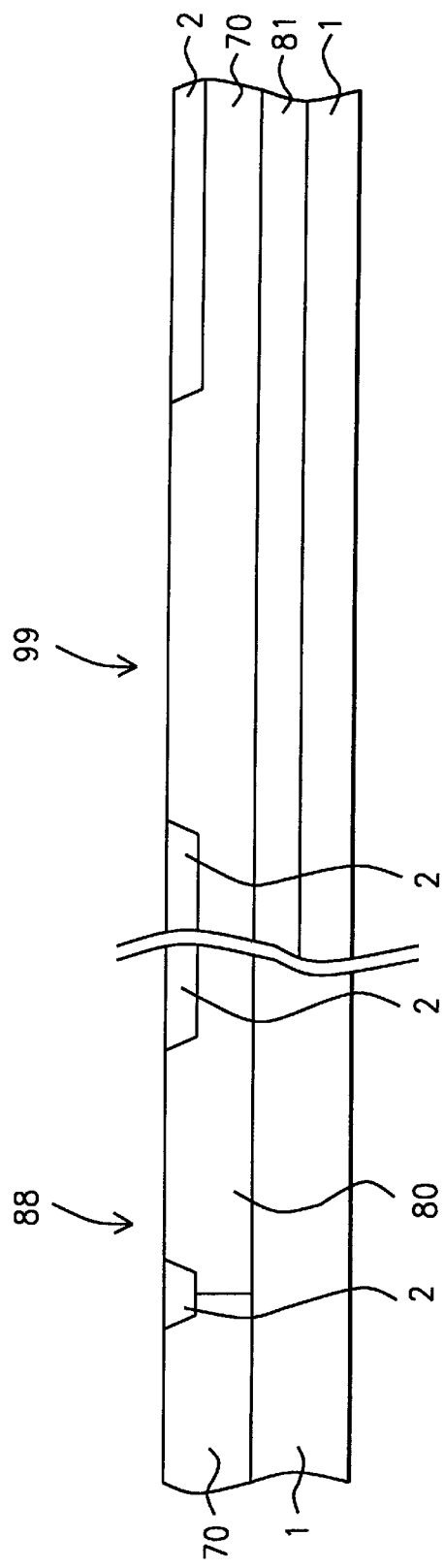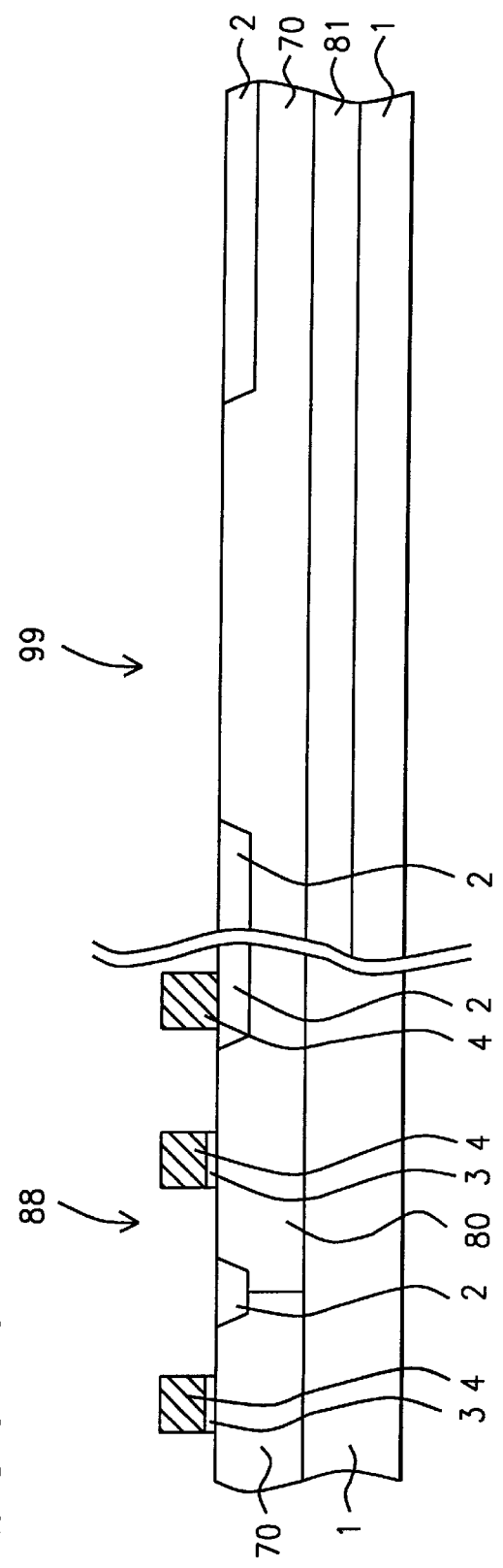

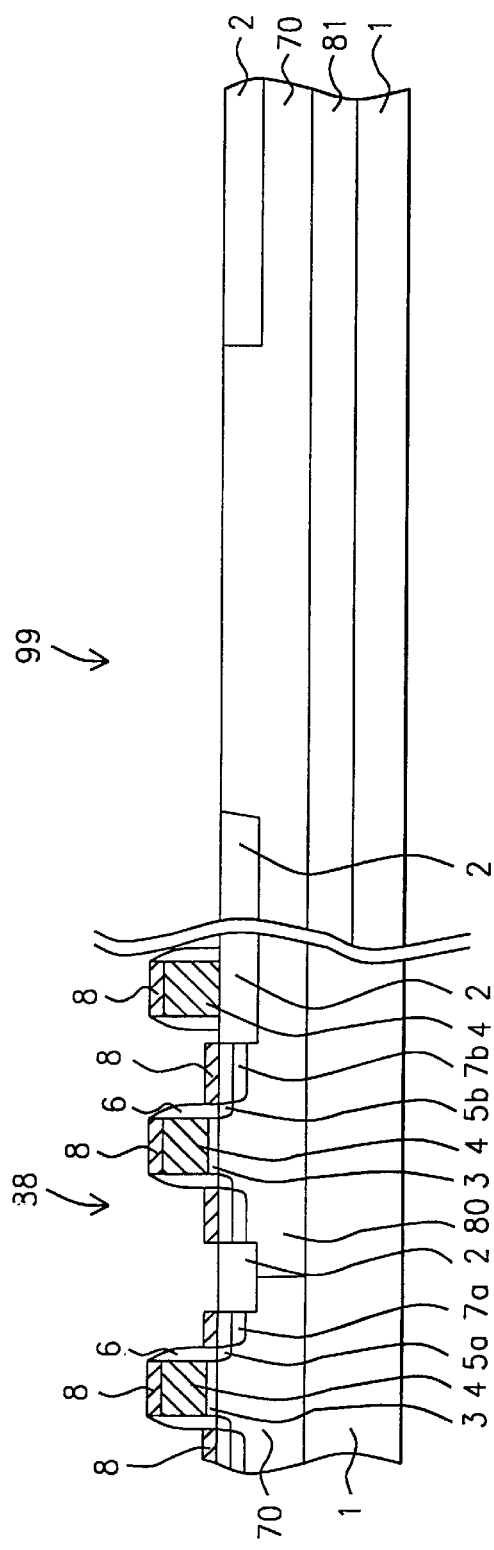
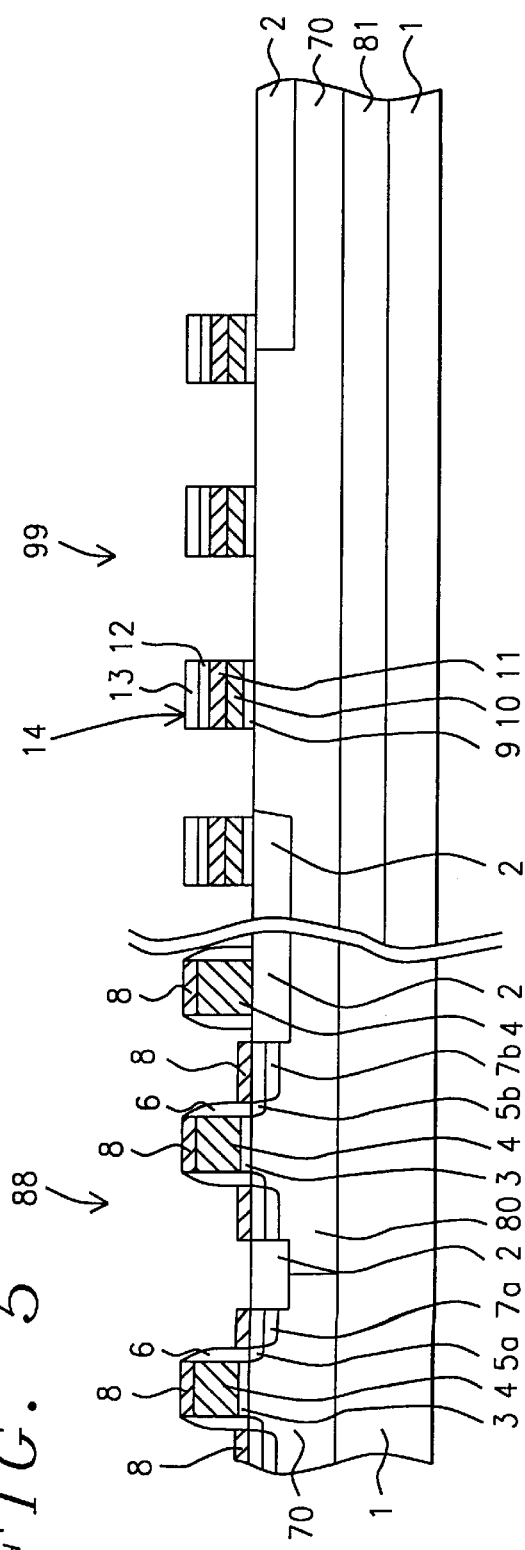

REDUCTION OF THE ASPECT RATIO OF DEEP CONTACT HOLES FOR EMBEDDED DRAM DEVICES

Related Patent Activity—"A METHOD TO REDUCE CONTACT HOLE ASPECT RATIO FOR EMBEDDED DRAM ARRAYS AND LOGIC DEVICES, VIA THE USE OF A TUNGSTEN BIT LINE STRUCTURE" C. J. Wang, W. C. Chiang, both of Taiwan Semiconductor Manufacturing Corp, invention disclosure TSMC97-436, assigned to a common assignee.

BACKGROUND OF THE INVENTION

(1) Field of the Invention

This invention relates to methods used to fabricate semiconductor devices, and more specifically a process used to reduce the aspect ratio of contact holes for logic and memory devices, integrated on a single semiconductor chip.

(2) Description of Prior Art

Advanced semiconductor chips, now being manufactured in industry, are composed of logic or memory devices. Logic devices are used to process information or data, while memory devices are used for data storage. These two types of devices can be found in almost all computers, however they are usually found on specific chips, reserved for either logic or memory applications. In systems in which logic and memory devices are packaged separately, data signals between the two may have to pass through several levels of packaging, which can result in undesirable propagation delays. In addition the manufacturing costs for fabricating wafers producing only logic chips, and wafers with only memory chips, are greater than if both logic and memory applications can be incorporated on the same chip. Therefore for performance and cost reasons the semiconductor industry has been motivated to produce a semiconductor chip with both the desired logic and memory requirements.

One difficulty encountered when attempting to integrate logic cells, with memory cells that are comprised of embedded dynamic random access memory, (DRAM), devices, is the ability to open contact holes, to regions of a semiconductor substrate, in thick insulator layers. The DRAM devices, comprised of bit line structures, as well as stacked capacitor structures, both located overlaying the semiconductor substrate, require thick insulator layers, to successfully isolate these components from adjacent conductive features. In addition with the use of sub—0.25 um groundrules, the contact holes in the thick insulator layers can be designed to dimensions as narrow as 0.3 um, in diameter, resulting in contact hole aspect ratios of about 7 to 1. This high contact hole aspect ratio is not only difficult to create, via anisotropic reactive ion etching procedures, but also difficult to fill, using conventional chemical vapor deposition, or plasma deposition procedures.

This invention will describe a process for integrating logic devices, and embedded DRAM devices, in which the aspect ratio of a contact hole, opened in about 20,000 Angstroms of insulator layer, and used to expose active logic and array device regions, is reduced. This is accomplished by initially forming tungsten plug structures, in self-aligned contact openings, located between gate structures, in the embedded DRAM region, while also forming tungsten structures, in a lower portion of contact holes, used to expose active device regions in the logic area. An upper portion of the contact hole is then formed, overlaying and exposing the tungsten structure, residing in the lower portion of the contact hole. The aspect ratio of the upper portion of the contact hole is now reduced, when compared to contact holes formed without the tungsten structure, in the lower portion of the contact hole. In addition this invention includes the formation of tungsten structures, on N type, as well as P type, regions. If N type doped, polysilicon structures were used in place of tungsten, a diode affect would occur as a result of the N type, polysilicon structure contacting a P type source/drain regions, of a PFET device. Thus the creation of a two stage contact hole, used to reduce the aspect ration of sub-micron diameter, deep contact holes, can also be used for both P type, and N type contacts, in logic regions, due to the use of tungsten filling of the lower portion of the contact holes. In addition this invention will offer a second iteration in which a two stage contact hole opening procedure, again used to reduce the aspect ratio of the contact hole is described, however for this iteration the first portion of the two stage contact hole opening, is formed after formation of the capacitor structure. In the first iteration the first portion of the two stage contact hole opening, was formed prior to formation of the capacitor structure. Prior art, such as Liang et al, in U.S. Pat. No. 5,716,881, describe a process using tungsten plugs to connect overlying, and underlying metal structures, however that prior art does not show the two stage contact hole formation, used in the present invention, featuring tungsten structures, located in a lower portion of contact holes, located in both logic and memory regions, and with the tungsten structures, overlying and contacting, both N type, and P type regions, in a semiconductor substrate.

SUMMARY OF THE INVENTION

It is an object of this invention to provide a process for fabricating logic devices, and DRAM memory devices, on the same silicon chip.

It is another object of this invention to reduce the aspect ratio of narrow diameter contact holes, for logic and DRAM memory devices, created in thick insulator layers, via use of a two stage, contact hole formation procedure, and a two stage metal fill procedure, with a first iteration featuring the formation of the lower portion of the two stage contact hole, created prior to the formation of a capacitor structure, while a second iteration describes a two stage contact hole opening, in which the lower portion of the two stage contact hole opening is formed after formation of a capacitor structure.

It is still another object of this invention to initially form the lower portion of the contact holes, in a first insulator layer, exposing P type, and N type source/drain regions, in the region of the semiconductor substrate used for logic devices, while forming the lower portion of the contact holes, in the first insulator layer, in a region of the semiconductor substrate to be used for DRAM memory devices, with the lower portions of the contact holes, in the DRAM region, providing a self-aligned contact opening, exposing source/drain regions, located between the gate structures.

It is yet another object to fill the lower portion of the contact holes, located in both the logic and DRAM regions, with tungsten.

It is still yet another object of this invention to form a storage node contact hole, and a bitline contact hole, in upper levels of insulator layers, exposing the top surface of tungsten structures, residing in the lower portion of the contact holes, located in the DRAM memory region.

It is still yet another object of this invention to form the upper portions of the contact holes, in the upper levels of insulator layers, exposing the top surface of the tungsten structures, located in the lower portion of contact holes, in the logic region, and exposing the top surface of bitline and capacitor structures, located in the DRAM memory region.

In accordance with the present invention a fabrication process is described for integrating DRAM and logic devices on the same semiconductor chip, featuring a two stage contact hole opening procedure, used to reduce the aspect ratio for narrow diameter contact holes, in thick insulator layers, and featuring the filling of the lower portion of the contact holes, in both logic and DRAM memory regions, with tungsten. A first region of a semiconductor substrate is used for the logic devices, while a second region of the semiconductor substrate is used for the DRAM memory devices. An N well region, used for subsequent P channel, (PFET) devices, and a P well region, used for subsequent N channel, (NFET) devices, are formed in the logic region of the semiconductor substrate. Insulator filled, shallow trenches are next formed in the logic, as well as the DRAM memory region, for purposes of isolation. Polysilicon gate structures are formed, on a first gate insulator layer, in the logic region, followed by the formation of P type, and N type, lightly doped source/drain regions, silicon nitride spacers, located on the sides of the polysilicon gate structures, and P type, and N type, heavily doped source/drain regions, for the PFET and NFET devices in the logic region. The polysilicon gate structures and the heavily doped source/drain regions, are then overlaid with a metal silicide layer. Silicon nitride capped, polycide, (metal silicide-polysilicon), gate structures are next formed, on a second gate insulator layer, in the DRAM memory regions, followed by the formation of N type, lightly doped source/drain regions, in regions of the semiconductor substrate, not covered by the silicon nitride capped, polycide gate structure, then followed by the formation of silicon nitride spacers, on the sides of the silicon nitride capped, polycide gate structures.

After deposition, and planarization, of a first insulator layer, the lower portion of the contact holes, are opened, exposing heavily doped, source/drain regions, in the logic region, while the lower portion of the contact holes, in the DRAM memory region, are designed to provide two self-aligned contact, (SAC), openings, exposing source/drain regions, located between silicon nitride capped, polycide gate structures. A layer of tungsten is then deposited, and subjected to a chemical mechanical polishing procedure, to create tungsten structures, in the lower portion of the contact holes, in the logic region, and to create two SAC structures, in the lower portion of the contact holes, in the DRAM memory region. A dual damascene opening, comprised of a wide diameter opening, in a top portion of a second insulator layer, and a narrow diameter opening, in a bottom portion of the second insulator layer, is next formed, exposing the top surface of a first, tungsten SAC structure. A bitline contact plug, and bitline structure, are next formed in the dual damascene opening. A storage node contact opening, is next formed in a third insulator layer, and in the second insulator layer, exposing the top surface of a second, tungsten SAC structure, followed by the formation of a storage node contact plug, in the storage node opening.

A wide opening is made in a fourth insulator layer, exposing the top surface of the storage node contact plug, followed by the formation of a storage node structure, comprised of vertical polysilicon features, located on the sides of the wide opening, connected by a horizontal polysilicon feature, located at the bottom of the wide opening, and contacting the storage node contact plug. After removal of the fourth insulator layer, a capacitor dielectric layer, and an upper capacitor plate, are formed on the polysilicon storage node structure, completing the fabrication of the capacitor structure. A fifth insulator layer is deposited and planarized, followed by the opening of the upper portion of the contact holes. The upper portion of contacts holes, in the logic region, is formed in the fifth, third, and second insulator layers, exposing the top surface of the tungsten structure, located in the lower portion of the contact hole. In the DRAM memory region, the upper portion of contact holes are formed: in the fifth insulator layer, exposing the upper capacitor plate; in the fifth, and third insulator layers, exposing the bit line structure; and in the fifth, third, second, and first insulator layers, exposing the top surface of a polycide gate structure. Conductive structures are then formed in all of the upper portion of contact holes, contacting the tungsten structure, located in the lower portion of the contact holes, in the logic regions, while contacting the capacitor, bitline, and polycide structures, in the DRAM memory region.

A second iteration of this invention differs from the above iteration in that the first portion, of the two stage contact hole opening, is created after formation of the capacitor structure.

BRIEF DESCRIPTION OF THE DRAWINGS

The object and other advantages of this invention are best described in the preferred embodiment with reference to the attached drawings that include:

FIGS. 1–18, which schematically, in cross-sectional style, illustrates the key stages of fabrication used to construct a logic region, and an DRAM memory region, on a semiconductor substrate, featuring the use of a two stage contact hole opening procedure, employed to reduce the aspect ratio for the deep, narrow diameter contact holes, and also featuring tungsten filling of the lower portion of the contact holes, in both logic, and DRAM memory regions, and in which the lower portion of the two stage contact hole opening, is formed prior to formation of the DRAM capacitor structure.

DESCRIPTION OF THE PREFERRED EMBODIMENTS

Figure 3:
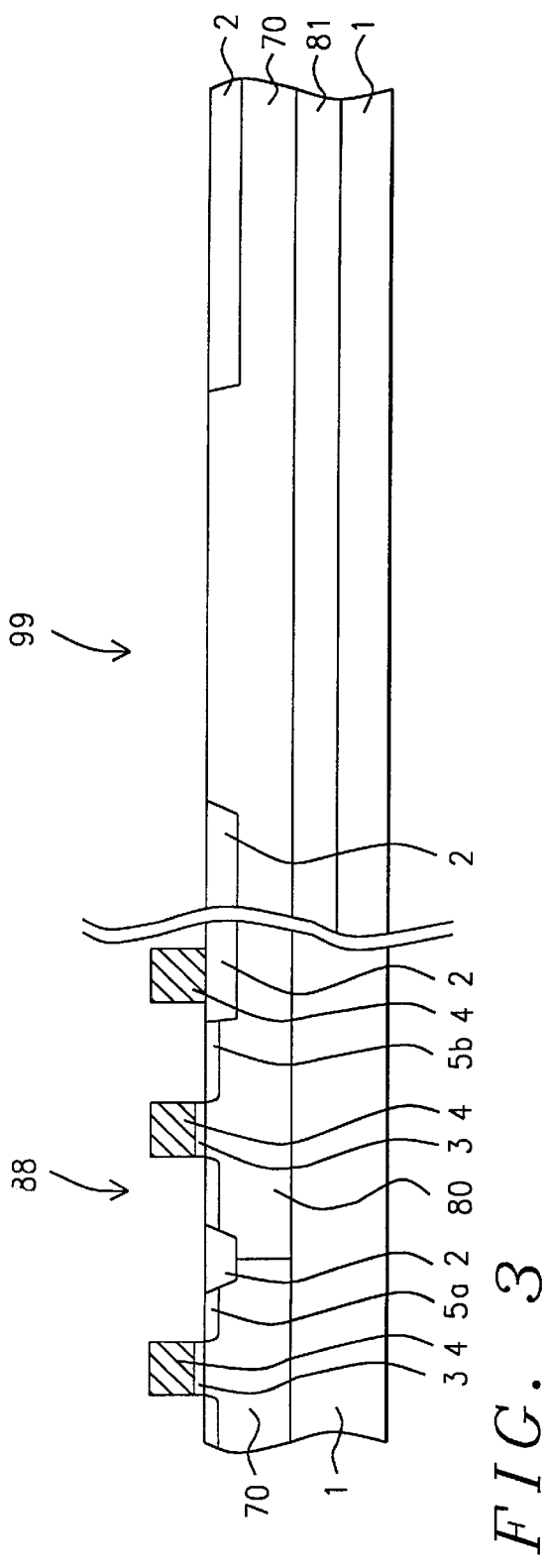

The fabrication process used to form logic devices, and DRAM memory devices, on a single semiconductor chip, featuring a two stage, contact hole opening procedure, used to reduce the aspect ratio of deep, narrow diameter contact holes, in thick insulator layers, and also featuring tungsten filled, lower portion of contact holes, for both logic and DRAM memory devices, will now be covered in detail. FIG. 1, indicates region 88, of semiconductor substrate 1, to be used for logic devices, and region 99, of semiconductor substrate 1, to be used for DRAM memory devices. A P type, single crystalline silicon substrate 1, having a <100> crystallographic orientation, is used. A P well region 70, to be used for subsequent N channel, (NFET), devices, is formed in logic region 88, via ion implantation of boron, or $BF_2$ ions. This ion implantation procedure can also be applied to DRAM memory region 99, to provide the P type doping concentration, needed for the NFET devices, in DRAM memory region 99. Photoresist blockout masking, is used to protect the area of logic region 88, to be used for subsequent P channel, (PFET), devices, from the P well ion implantation procedure. After formation of P well regions 70, the photoresist blockout mask is removed via plasma oxygen ashing, and careful wet cleans, and N well region 80, is formed, via ion implantation of arsenic or phosphorous ions, in the area of logic region 88, to be used for the PFET devices. After removal of this photoresist blockout mask, another photoresist mask is used to protect logic region 88, from another arsenic, or phosphorous, ion implantation procedures, applied to DRAM memory region 99, creating a deep, N type region 81, needed for isolation between the logic and memory regions. The photoresist blockout mask is again removed via plasma oxygen ashing and careful wet cleans. The results if these procedures are schematically shown in FIG. 1.

Isolation of individual devices in both logic and memory regions, is provided by shallow trench isolation, (STI), regions 2, shown schematically in FIG. 1, formed by: creating a shallow trench in semiconductor substrate 1, via conventional photolithographic and anisotropic reactive ion etching, (RIE), procedures; deposition of a silicon oxide layer, completely filling the shallow trench; and removal of the silicon oxide layer from the top surface of semiconductor substrate 1, via chemical mechanical polishing, (CMP), or via RIE procedures.

A first gate insulator layer 3, comprised of silicon dioxide, is thermally grown in an oxygen - steam ambient, at a temperature between about 800 to 1000° C., to a thickness between about 40 to 60 Angstroms, and shown schematically in FIG. 2. A polysilicon layer 4, is next deposited, via low pressure chemical vapor deposition, (LPCVD), procedures, to a thickness between about 1000 to 3000 Angstroms. Polysilicon layer 4, can be doped in situ, during deposition via the addition of arsine, or phosphine, to a silane ambient, or polysilicon layer 4, can be deposited intrinsically and doped via an ion implantation procedure, using arsenic or phosphorous ions. Conventional photolithographic, and anisotropic RIE procedures, using $Cl_2$ as an etchant, are used to form the polysilicon gate structures, comprised of polysilicon layer 4. The photoresist shape, used to define the polysilicon gate structures, is accomplished via plasma oxygen ashing procedures and careful wet cleans procedures. The wet clean portion of the photoresist removal procedure, containing a dilute hydrofluoric acid component, results in the removal of regions of gate insulator 3, not covered by the polysilicon gate structures, in logic region 88, in addition to the removal of unprotected gate insulator 3, from the surface of semiconductor substrate 1, in DRAM memory region 99. This is schematically shown in FIG. 2.

FIG. 3, schematically shows the creation of lightly doped source/drain regions, for the NFET devices, and for the PFET devices, of logic region 88. A photoresist shape is used as a first block out mask, allowing N type, lightly doped source/drain regions 5a, to only be formed for NFET devices, in P well region 70, in logic region 88, via an ion implantation of arsenic or phosphorous, at an energy between about 20 to 50 KeV, and at a dose between about 1E12 to 1E13 atoms/$cm^2$. After removal of the first blockout mask, via plasma oxygen ashing and careful wet cleans, another photoresist shape, used as a second block out mask, is used to allow P type, lightly doped source/drain regions 5b, to be formed only in N well region 80, of logic region 88 to be used for PFET devices. The P type, lightly doped source/drain regions 5b, schematically shown in FIG. 3, are formed via ion implantation of boron ions, at an energy between about 20 to 50 KeV, at a dose between about 1E12 to 1E14 atoms/$cm^2$. The second block out mask is again removed via plasma oxygen ashing and careful wet cleans. The width of polysilicon gate structures, are designed to result in channel lengths of 0.25 um, or less, providing enhanced performance, for the logic devices.

Figure 4:
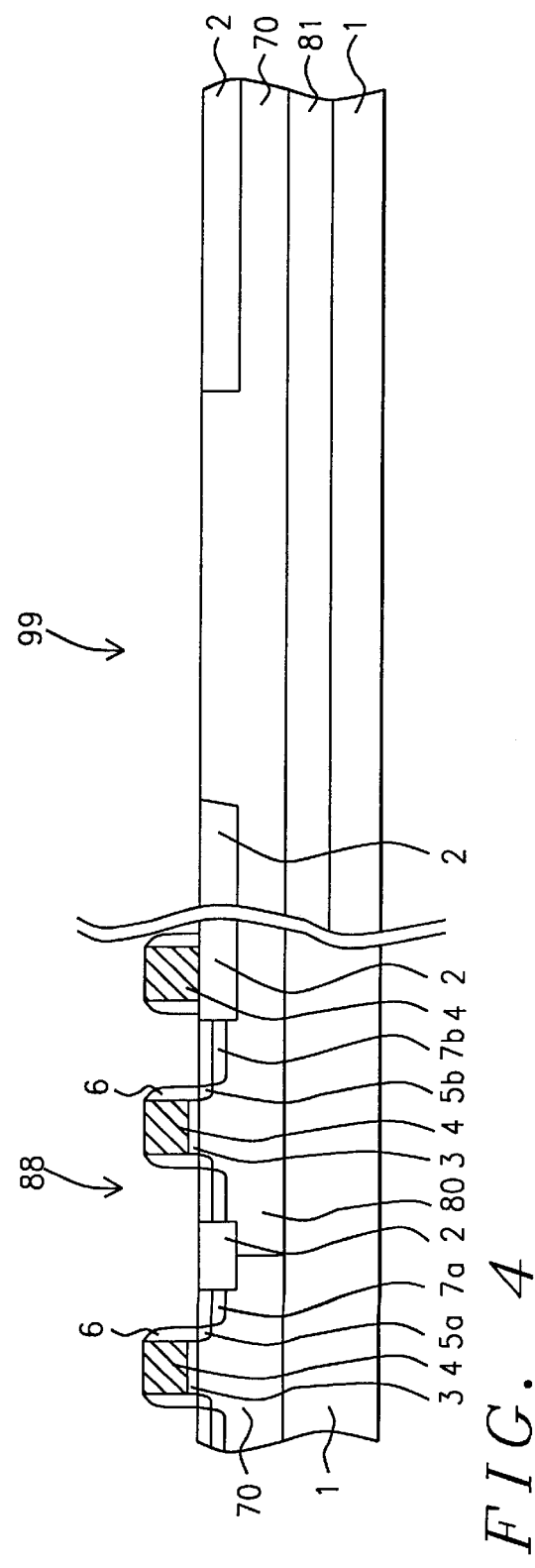

A silicon nitride layer is next deposited, using LPCVD or plasma enhanced chemical vapor deposition, (PECVD), procedures, at a thickness between about 800 to 2000 Angstroms. An anisotropic RIE procedure, using $SF_6$ as an etchant, is then performed, creating silicon nitride spacers 6, located on the sides of the polysilicon gate structures. Heavily doped, N type source/drain regions 7a, and heavily doped, P type source/drain regions 7b, shown schematically in FIG. 4, are next formed, using the same photoresist block out procedures and sequence, previously used for the lightly doped, N type, and the lightly doped, P type, source/drain regions. Heavily doped, N type source drain region 7a, is formed via ion implantation of arsenic or phosphorous, at an energy between about 20 to 60 KeV, at a dose between about 1E15 to 1E16 atoms/$cm^2$, while heavily doped, P type source/drain region 7b, is formed via ion implantation of boron ions, at an energy between about 20 to 60 KeV, at a dose between about 1E15 to 1E16 atoms/$cm^2$. The photoresist block out shapes are removed via plasma oxygen ashing and careful wet clean procedures.

A layer of titanium is next deposited using R. F. sputtering procedures, to a thickness between about 200 to 400 Angstroms. A first anneal procedure, using either conventional furnace, or rapid thermal anneal, (RTA), procedures, at a temperature between about 600 to 800° C., is used to form a self-aligned, titanium silicide layer 8, in regions in which the titanium layer overlaid silicon or polysilicon surfaces, with the titanium layer remaining unreacted in regions overlying silicon oxide, or silicon nitride surfaces. The regions of unreacted titanium layer, are removed using a $H_2O_2$—$NH_4OH_4$ solution, resulting in self-aligned titanium silicide layer 8, on heavily doped source/drain regions, and resulting in more conductive word line structures, in logic region 88, comprised of titanium silicide layer 8, on the underlying polysilicon gate structures. This is schematically shown in FIG. 5. A second anneal, again performed either in a conventional, or an RTA furnace, at a temperature between about 800 to 900° C., is used to further reduce the resistance of titanium silicide layer 8.

Figure 7:
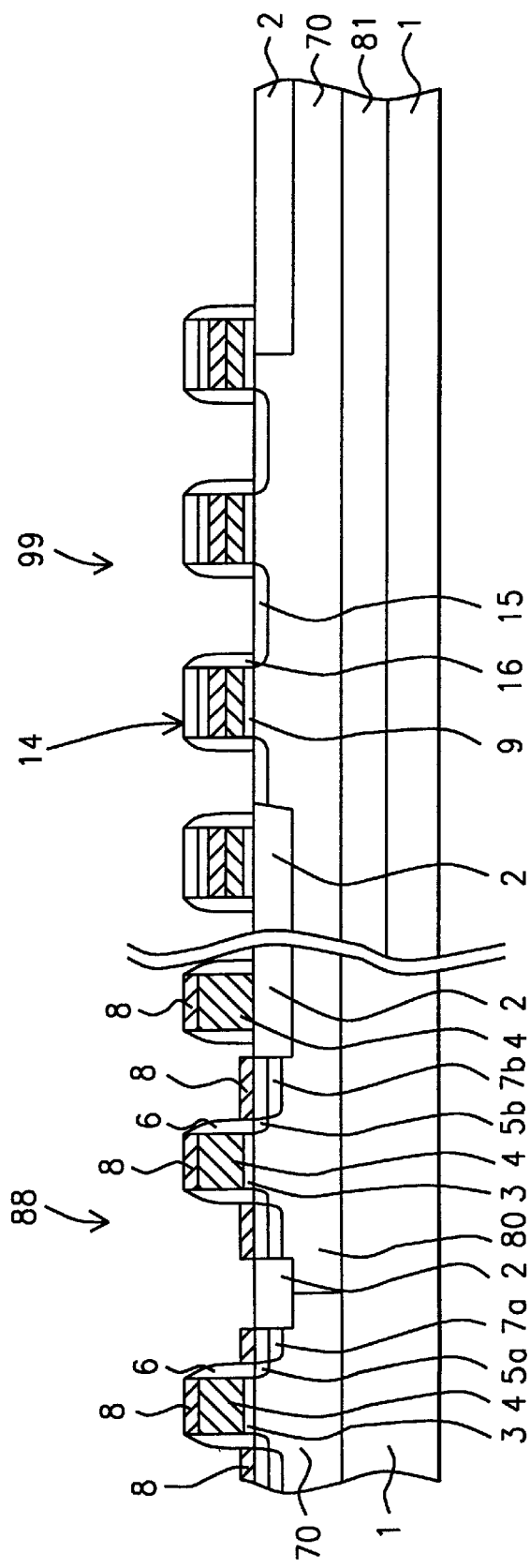

FIGS. 6–7, now describe the formation of the transfer gate transistors, used in DRAM array region 99. The formation of the gate structures used for logic and memory applications, can be accomplished using shared process steps, if desired, instead of forming them individually. However for this invention the formation of the gate structures, used in DRAM memory region 99, are formed after formation of the gate structures used in logic region 88. A second gate insulator layer 9, comprised of silicon dioxide, is thermally grown in a oxygen-steam ambient, at a temperature between about 800 to 1000° C., to a thickness between about 70 to 80 Angstroms. A polysilicon layer 10, is deposited via LPCVD procedures, to a thickness between about 1500 to 2500 Angstroms. Polysilicon layer 10, is either doped in situ, during deposition, via the addition of arsine, or phosphine, to a silane ambient, or polysilicon layer 10, is deposited intrinsically, and doped via ion implantation of arsenic or phosphorous. A tungsten silicide layer 11, is next deposited, via LPCVD procedures, to a thickness between about 750 to 1250 Angstroms, using silane and tungsten hexafluoride as reactants. This is followed by the deposition of a silicon oxide layer 12, via PECVD or LPCVD procedures, at a thickness between about 200 to 500 Angstroms, followed by the deposition of a silicon nitride capping layer 13, again using LPCVD or PECVD procedure, at a thickness between about 1500 to 2500 Angstroms. Conventional photolithographic, and anisotropic RIE procedures, using $SF_6$ as an etchant for capping silicon nitride layer 13, using CHF$_3$ as an etchant for silicon oxide layer 12, and using Cl$_2$ as an etchant for tungsten silicide layer 11, and polysilicon layer 10, are used to create silicon nitride capped, polycide, (tungsten silicide-polysilicon), gate structures 14, schematically shown in FIG. 6.

After removal of the photoresist shape, used as an etch mask in the definition of silicon nitride capped, polycide gate structures 14, via plasma oxygen ashing and careful wet cleans, lightly doped, N type source/drain regions 15, are formed via ion implantation of arsenic or phosphorous ions, at an energy between about 20 to 60 KeV, at a dose between about 1E13 to 1E14 atoms/cm$^2$. The space between lightly doped, N type source drain regions 15, or the channel length of the DRAM, transfer gate transistors, is about 0.25 um. Regions of gate insulator layer 9, not covered by silicon nitride capped, polycide gate structures 14, are removed during the plasma oxygen ashing and wet clean procedures. A silicon nitride layer is next deposited via PECVD or LPCVD procedures, to a thickness between about 800 to 1500 Angstroms, followed by an anisotropic RIE procedure, using SF$_6$ as an etchant, creating silicon nitride spacers 16, on the sides of silicon nitride capped, polycide gate structures 14. This is schematically shown in FIG. 7.

Figure 8:
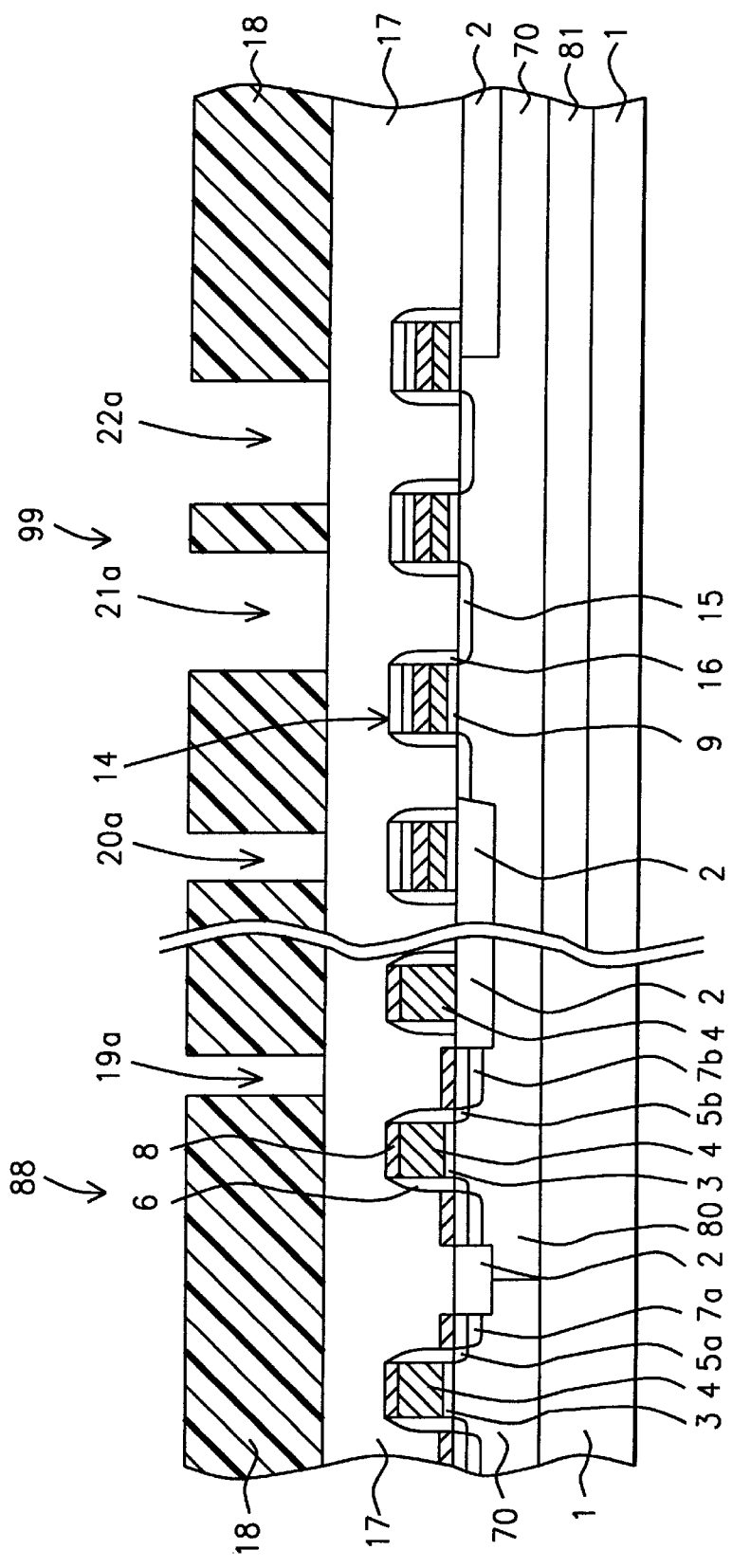
Figure 9:
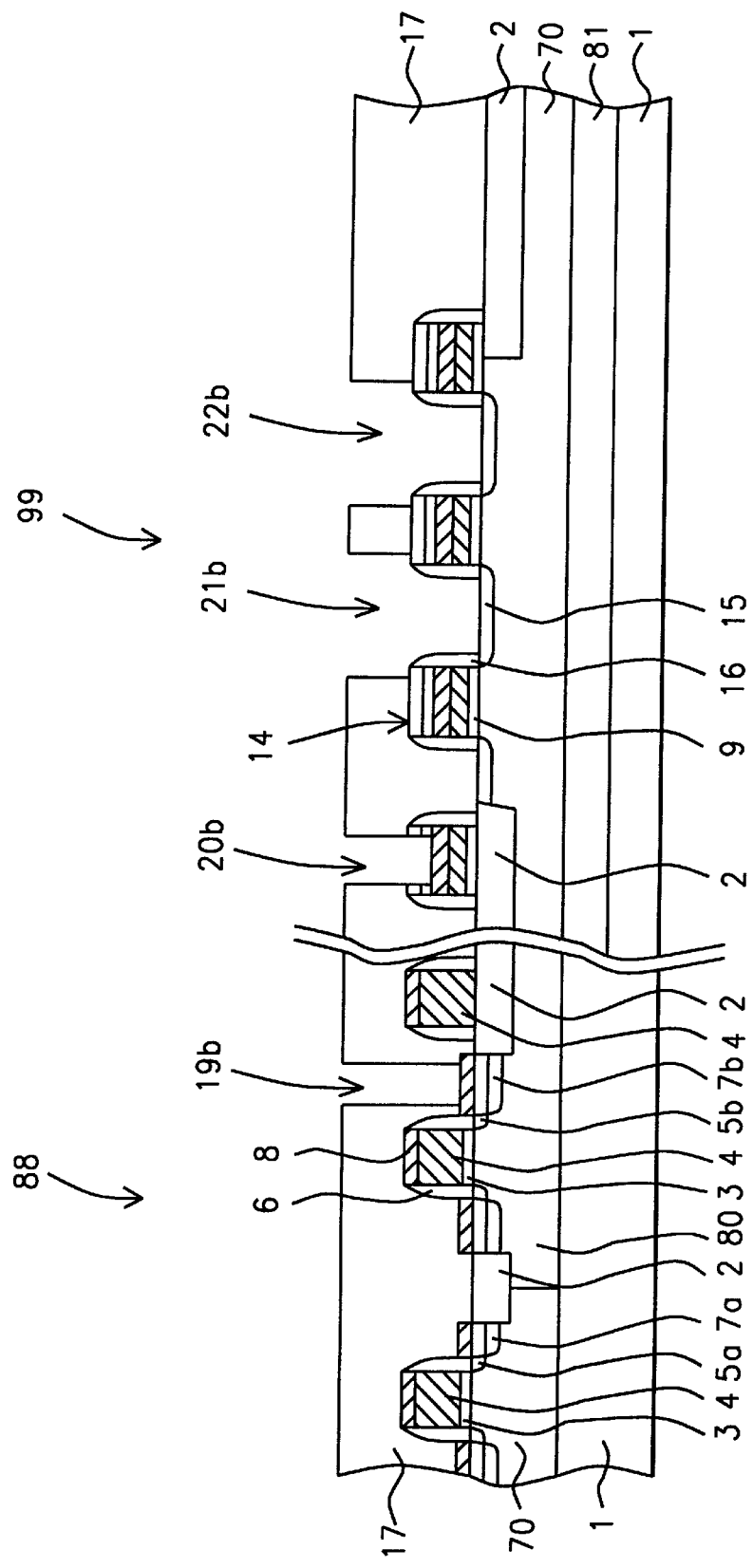
Figure 10:
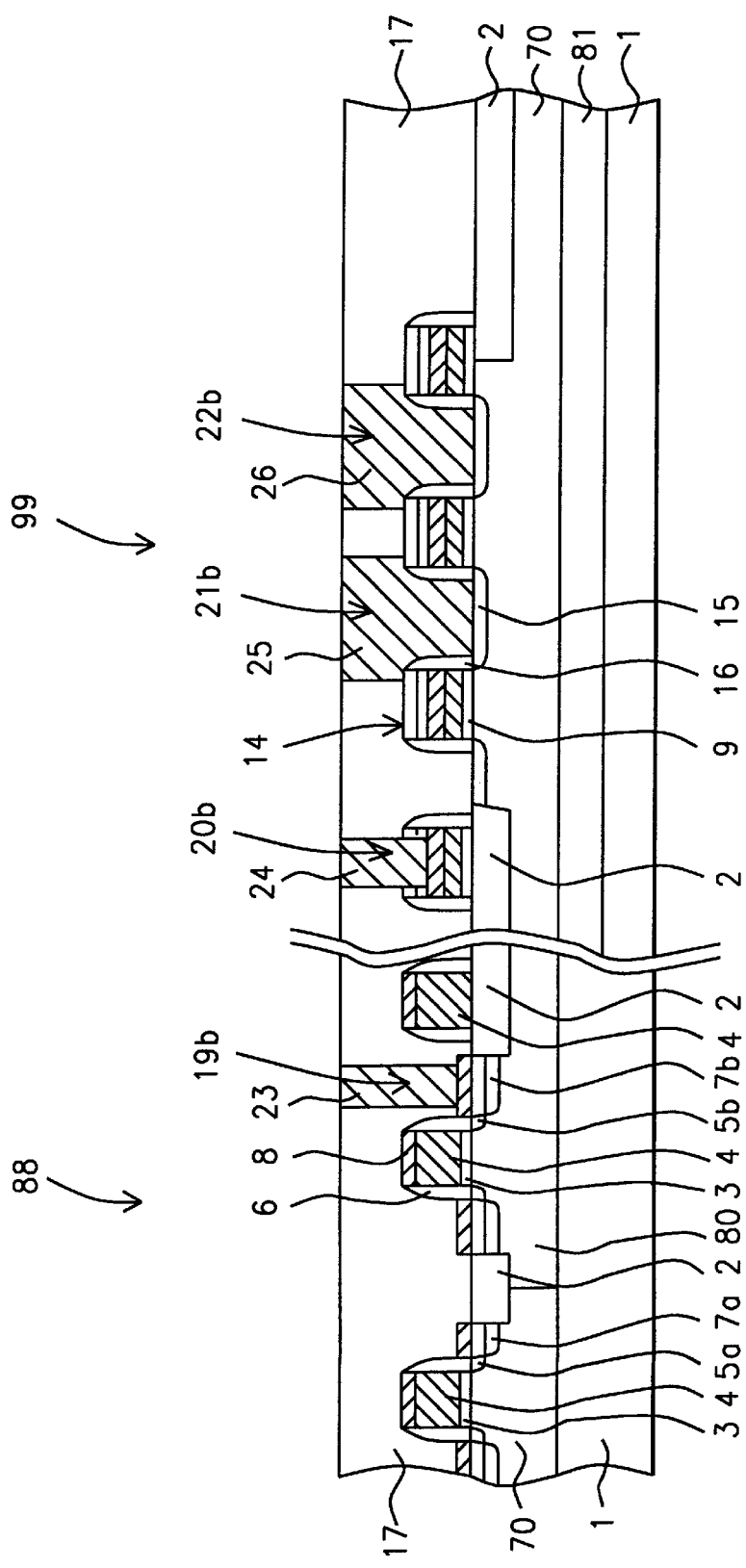
Figure 11:
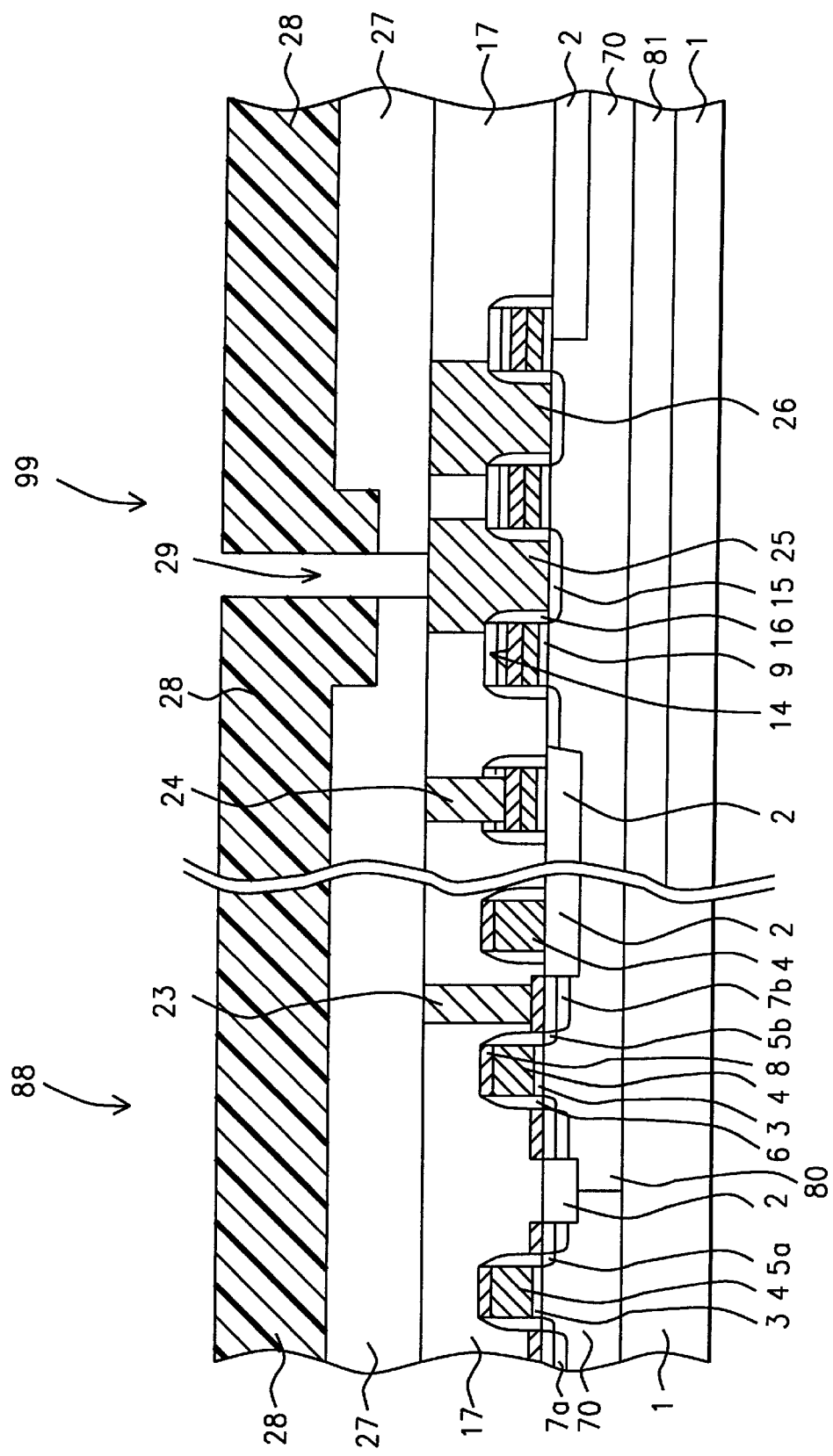

An insulator layer 17, comprised of silicon oxide, is obtained using LPCVD or PECVD procedures, at a thickness between about 7000 to 10000 Angstroms. Insulator layer 17, can also be a borophosphosilicate, (BPSG), layer, obtained via LPCVD or PECVD procedures. A planarization procedure, using a CMP procedure, is used to create a smooth top surface topography for insulator layer 17. This is shown schematically in FIG. 8. Photoresist shape 18, is next formed, with openings 19a, 20a, 21a, and 22a, exposing regions of planarized insulator layer 17, that directly overlay: heavily source/drain region 7b, in logic region 88; a silicon nitride capped, polycide gate structure, in DRAM memory region 99; a first lightly doped source/drain region, in DRAM memory region 99, and a second lightly doped source/drain region, in DRAM memory region 99.

The following description, including FIGS. 9–18, will now apply to a first iteration of this invention, in which the lower portion of a two stage contact hole opening, will be addresses prior to formation of a DRAM capacitor structure. A second iteration, illustrated in FIGS. 19–22, will later be described, teaching a procedure in which the lower portion of the two stage contact hole opening, will be formed after formation of the DRAM capacitor structure. An anisotropic RIE procedure, using CHF$_3$ as an etchant for insulator layer 17, is next used to create opening 19b, with a diameter between about 0.25 to 0.35 um, exposing a portion of the top surface of titanium silicide layer 8, overlying heavily doped source/drain region 7b, in logic region 88. The anisotropic RIE procedures also creates first self-aligned contact, (SAC), opening 21b, and second SAC opening 22b, located between silicon nitride capped, polycide gate structures 14, exposing lightly doped source/drain regions 15, in DRAM memory region 99. The SAC openings were formed in silicon oxide, insulator layer 17, with a width greater than the space between the silicon nitride capped, polycide gate structures. This is accomplished via the selectivity, or the high etch rate ratio of silicon oxide to silicon nitride, using CHF$_3$ as an etchant. Opening 20b, with a diameter between about 0.25 to 0.35 um, is formed in the portion of insulator layer, overlying the silicon nitride capped, polycide gate structure, followed by the removal of the portions of capping silicon nitride layer 13, and silicon oxide layer 12, accomplished while the remainder of insulator layer 17, was being removed for the SAC openings. This is shown schematically in FIG. 9. Photoresist shape 18, used as the etch mask for definition of the openings in insulator layer 17, is removed using plasma oxygen ashing and careful wet clean procedures.

A layer of tungsten is next deposited, via LPCVD procedures, at a thickness between about 3000 to 6000 Angstroms, completely filling openings 19b, 20b, 21b, and 22b. Removal of unwanted regions of tungsten, from the top surface of insulator layer, is accomplished using either a CMP procedure, or a selective, RIE procedure, using Cl$_2$ as an etchant, creating tungsten structure 23, in opening 19b, contacting heavily doped source/drain region 7b, in logic region 88, and creating tungsten structure 24, in opening 20b, contacting a polycide gate structure in DRAM memory region 99. This is shown schematically in FIG. 10. These procedures also create: SAC structure 25, in SAC opening 21b, to be subsequently used to allow an overlying DRAM bitline structure to communicate with a first lightly doped source/drain region; and SAC structure 26, in opening 22b, to be subsequently used for communication between an overlying DRAM capacitor structure, and a second lightly doped source/drain region. The tungsten SAC structures are also schematically shown in FIG. 10. It should be noted that the use of tungsten, in place of polysilicon, for the SAC structures, in DRAM memory region 99, allowed a single contact opening procedure to be used for both DRAM memory as well as logic devices, since tungsten on the P type, source/drain regions, in logic region 88, will not present a diode type phenomena, experienced if N type polysilicon was used to fill opening 19b. It should also be noted that openings to NFET regions, such as openings to heavily doped source/drain region 7a, (not shown in the drawings), followed by the creation of tungsten structures, in these openings, can also be achieved using the previous described procedures.

Insulator layer 27, comprised of silicon oxide, or BPSG, is next deposited using PECVD or LPCVD procedures, at a thickness between about 3000 to 4000 Angstroms. Photoresist masking, and anisotropic RIE procedures, using CHF$_3$ as an etchant, are used to create a wide opening, between about 0.30 to 0.40 um in diameter, in a top portion of insulator layer 27. After removal of the photoresist shape, used to create the wide diameter opening, photoresist shape 28, is formed, and used as a mask to allow an anisotropic RIE procedure, using CHF$_3$ as an etchant, to create a narrow opening, in the bottom portion of insulator layer 27, with the narrow opening having a diameter between about 0.25 to 0.35 um. The dual damascene opening 29, in insulator layer 27, comprised of an overlying wide diameter opening, and an underling narrow diameter opening, shown schematically in FIG. 11, exposes a portion of the top surface of SAC structure 25. Photoresist shape 28, is removed via plasma oxygen ashing and careful wet cleans.

Figure 12:
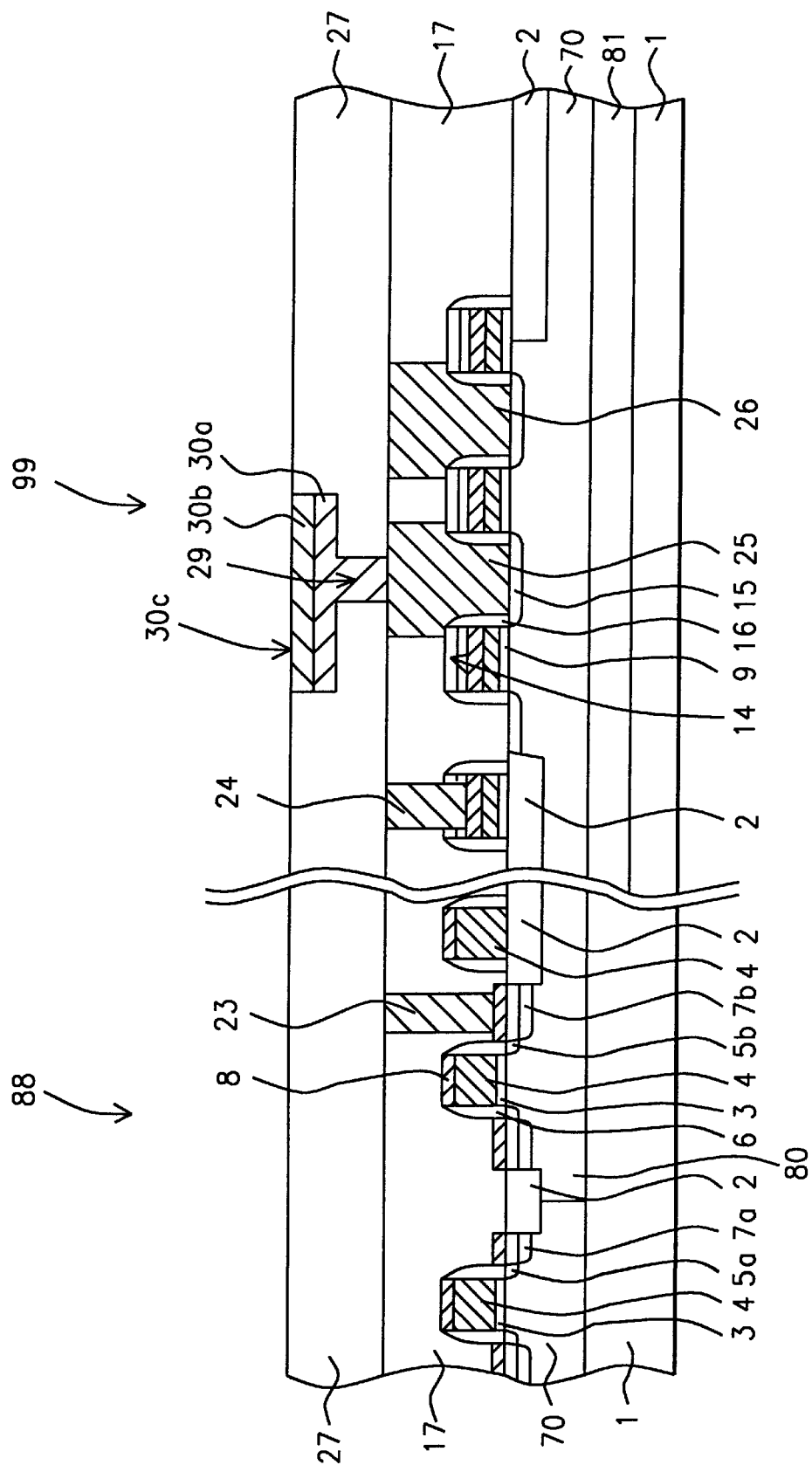

A polycide bitline structure 30c, is next formed in dual damascene opening 29, and shown schematically in FIG. 12. First, a polysilicon layer 30a, is deposited via LPCVD procedures, at a thickness between about 1000 to 2000 Angstroms, completely filling the narrow portion of dual damascene opening 29. Polysilicon layer 30a, can be doped in situ, during deposition, via the addition of arsine, or phosphine, to a silane ambient, or polysilicon layer 30a, can be deposited intrinsically, then doped via ion implantation procedures, using arsenic or phosphorous ions. A tungsten silicide layer 30b, is next deposited on polysilicon layer 30a, via LPCVD procedures, to a thickness between about 1000 to 2000 Angstroms. Definition of polycide bitline structure 30c, in dual damascene opening 29, is accomplished via removal of unwanted regions of tungsten silicide layer 30b, and of polysilicon layer 30a, from the top surface of insulator layer 27, via a CMP procedure, or via a selective RIE procedure, using $Cl_2$ as an etchant.

Figure 13:
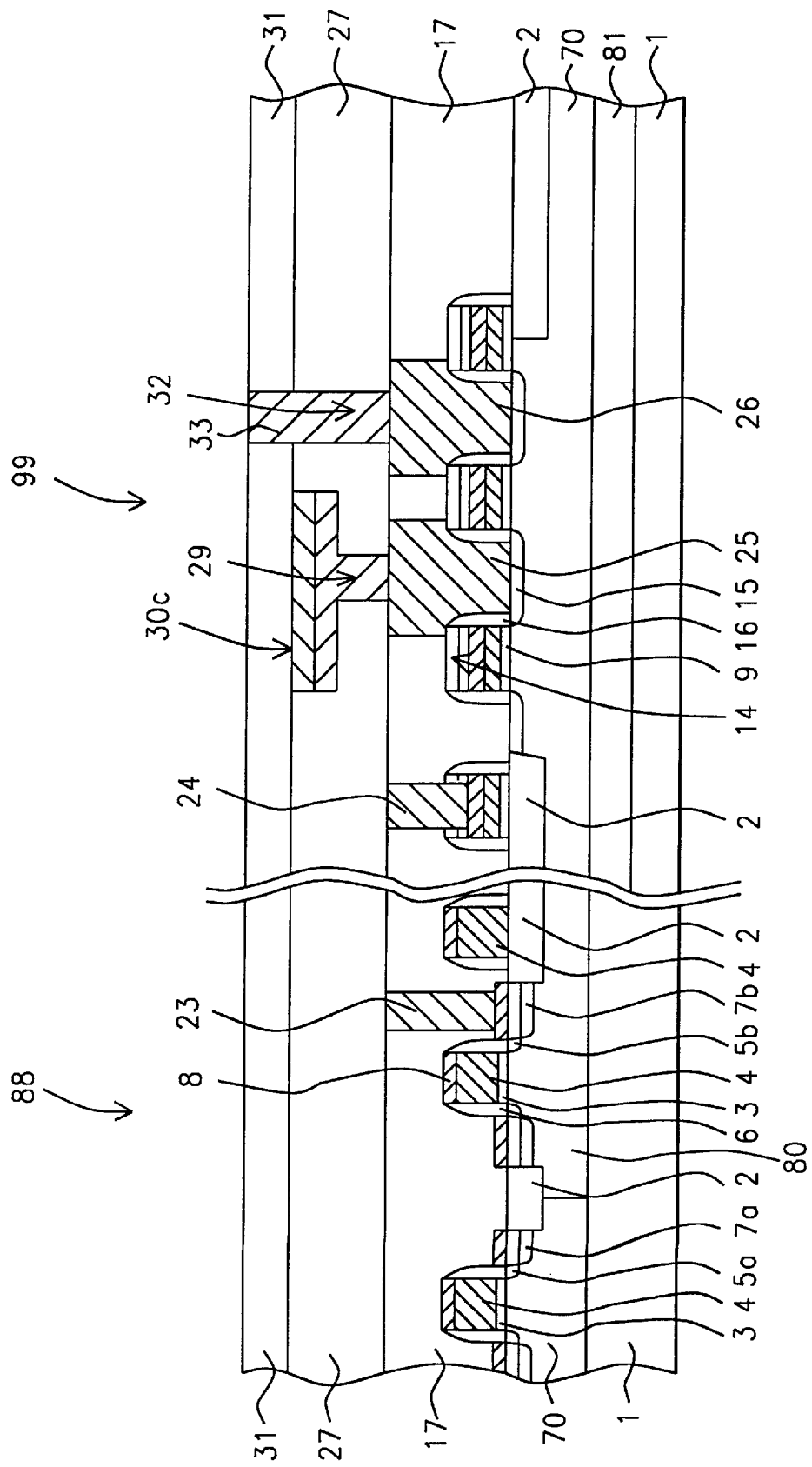

Insulator layer 31, comprised of either silicon oxide, BPSG, or a composite insulator layer. is next deposited via PECVD or LPCVD procedures, to a thickness between about 1500 to 2500 Angstroms. Insulator layer 31, is preferably a composite layer, comprised of a thin silicon nitride layer, on an underlying silicon oxide layer. The silicon nitride component of the composite insulator layer, will allow a subsequent, overlying silicon oxide shape, used for construction of a capacitor structure, to be selectively removed using dilute HF, without attacking underlying insulator layers. Photolithographic and anisotropic RIE procedures, are next employed to create storage node opening 32, in insulator layer 31, and in insulator layer 27, exposing a portion of the top surface of SAC structure 26. After removal of the photoresist shape used to define storage node opening 32, via plasma oxygen ashing, and careful wet cleans, a polysilicon layer is deposited, using LPCVD procedures, to a thickness between about 1000 to 3000 Angstroms, completely filling storage node opening 32. The polysilicon layer is doped in situ, during deposition, via the addition of arsine, or phosphine, to a silane ambient. A chemical mechanical polishing procedure, or a selective RIE procedure, using $Cl_2$ as an etchant, is then used to remove polysilicon from the top surface of insulator layer 31, resulting in the formation of storage node contact structure 33, in storage node opening 32. This is schematically shown in FIG. 13.

Figure 14:
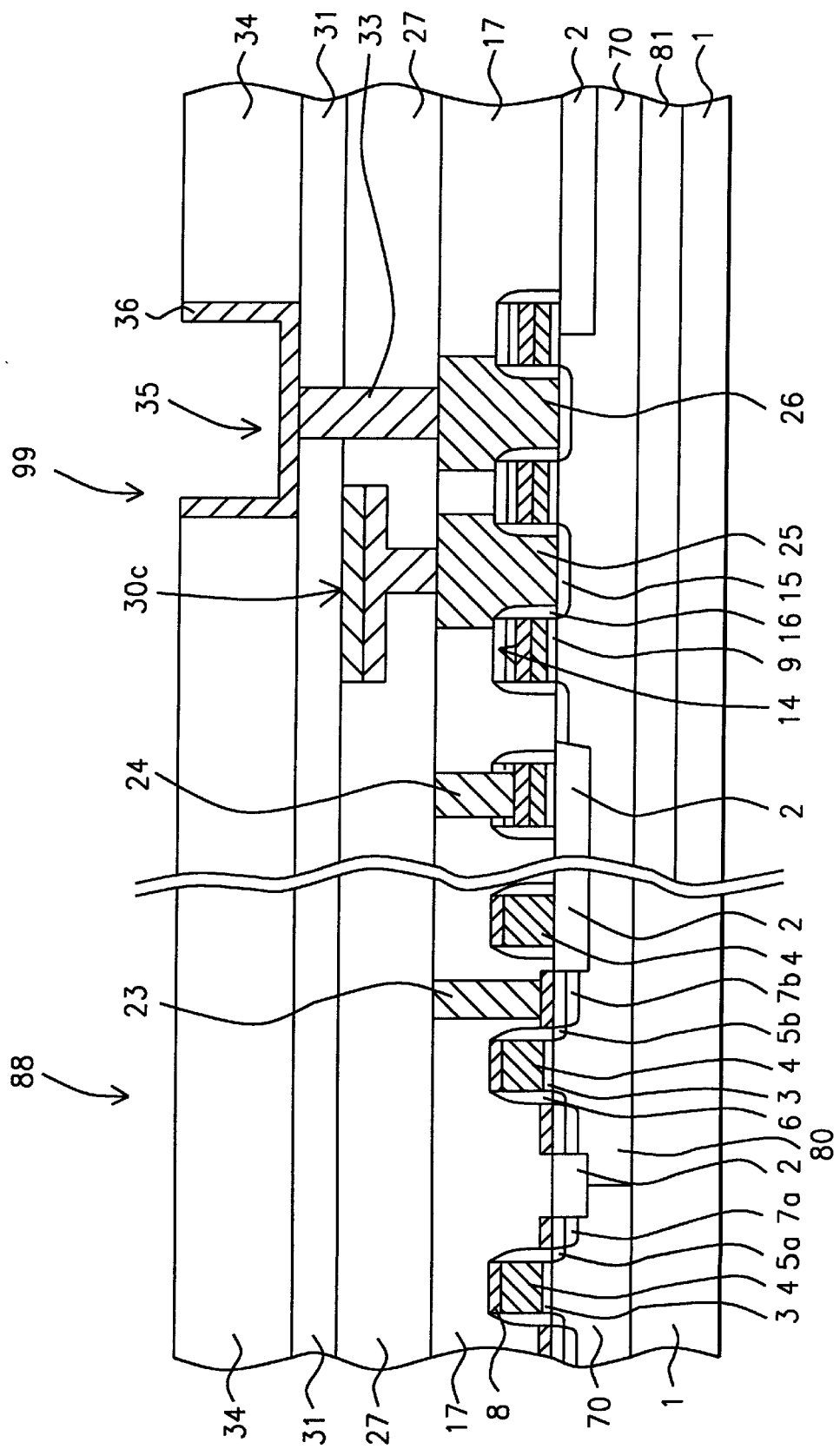

A silicon oxide layer 34, is next deposited via LPCVD or PECVD procedures, to a thickness between about 4000 to 6000 Angstroms. Photolithographic and selective, anisotropic RIE procedures, using $CHF_3$ as an etchant, are used to create opening 35, in silicon oxide layer 34, exposing the top surface of storage node contact structure 33. This is schematically shown in FIG. 14. The selectivity, or high etch rate ratio, of silicon oxide to the silicon nitride component of composite insulator layer 31, allowed the formation of opening 35, to terminate at the appearance of silicon nitride, in insulator layer 31. After removal of the photoresist shape, used to define opening 35, again via plasma oxygen ashing and careful wet cleans, polysilicon layer 36, is deposited using LPCVD procedures, to a thickness between about 200 to 400 Angstroms. Polysilicon layer 36, is doped in situ, during deposition, via the addition of arsine, or phosphine, to a silane ambient. A CMP procedure is next employed, removing regions of polysilicon layer 36, from the top surface of silicon oxide layer 34, creating a crown shaped structure, comprised of vertical polysilicon features, on the sides of opening 35, connected by the horizontal segment of polysilicon layer 36, located at the bottom of opening 35, overlying, and contacting the top surface of storage node contact structure 33. This is schematically shown in FIG. 14.

Figure 15:
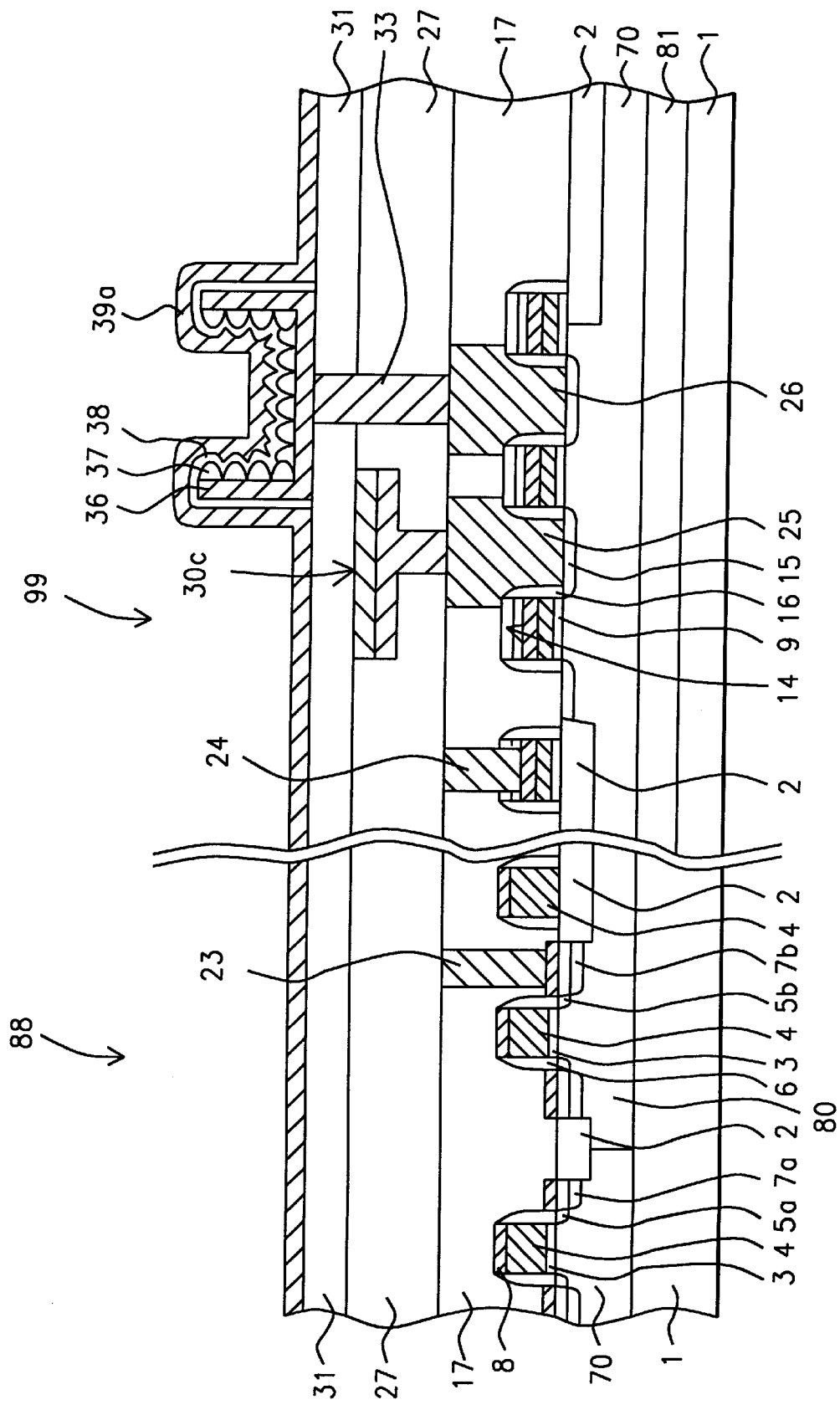

Silicon oxide layer 34, is next selectively removed, using a buffered hydrofluoric acid solution, resulting in the polysilicon crown shaped structure, located on, and extending upwards, from the top surface of insulator layer 31. This is accomplished using the underlying silicon nitride layer, of insulator layer 31, as an etch stop. To increase the surface area of a subsequent capacitor structure, a hemispherical grain, (HSG), silicon layer 37, is selectively grown on the exposed surfaces of polysilicon layer 36, resulting in a crown shaped storage node structure, schematically shown in FIG. 15, comprised of HSG polysilicon layer 37, on polysilicon layer 36. HSG silicon layer 37, is deposited at a temperature between about 400 to 600° C., at a pressure between about 0.1 to 1.0 mtorr, and with a silane flow between about 20 to 60 sccm, and offers a roughened surface, comprised of convex and concave features, resulting in the desired, increased surface area, and thus increased capacitance and performance, when compared to counterpart storage node structures, fabricated with smooth polysilicon surfaces. HSG silicon layer 37, can be formed prior to, or after, selective removal of silicon oxide layer 34. In this description, FIG. 15, HSG silicon layer 37, is formed prior to removal of silicon oxide layer 34. A capacitor dielectric layer 38, comprised of an ONO layer, (Oxidized Nitride), at an equivalent silicon dioxide thickness between about 40 to 60 Angstroms, is formed the crown shaped, storage node structure. A tantalum oxide layer can also be used as the capacitor dielectric layer, if desired. Finally a polysilicon layer 39a, is then deposited, via LPCVD procedures, to a thickness between about 500 to 1500 Angstroms. Polysilicon layer 39a, is either doped in situ, during deposition, via the addition of arsine, or phosphine, to a silane ambient, or polysilicon layer 39a, is deposited intrinsically and doped via ion implantation procedures, using arsenic or phosphorous ions. The result of these procedures is schematically shown in FIG. 15.

Figure 16:
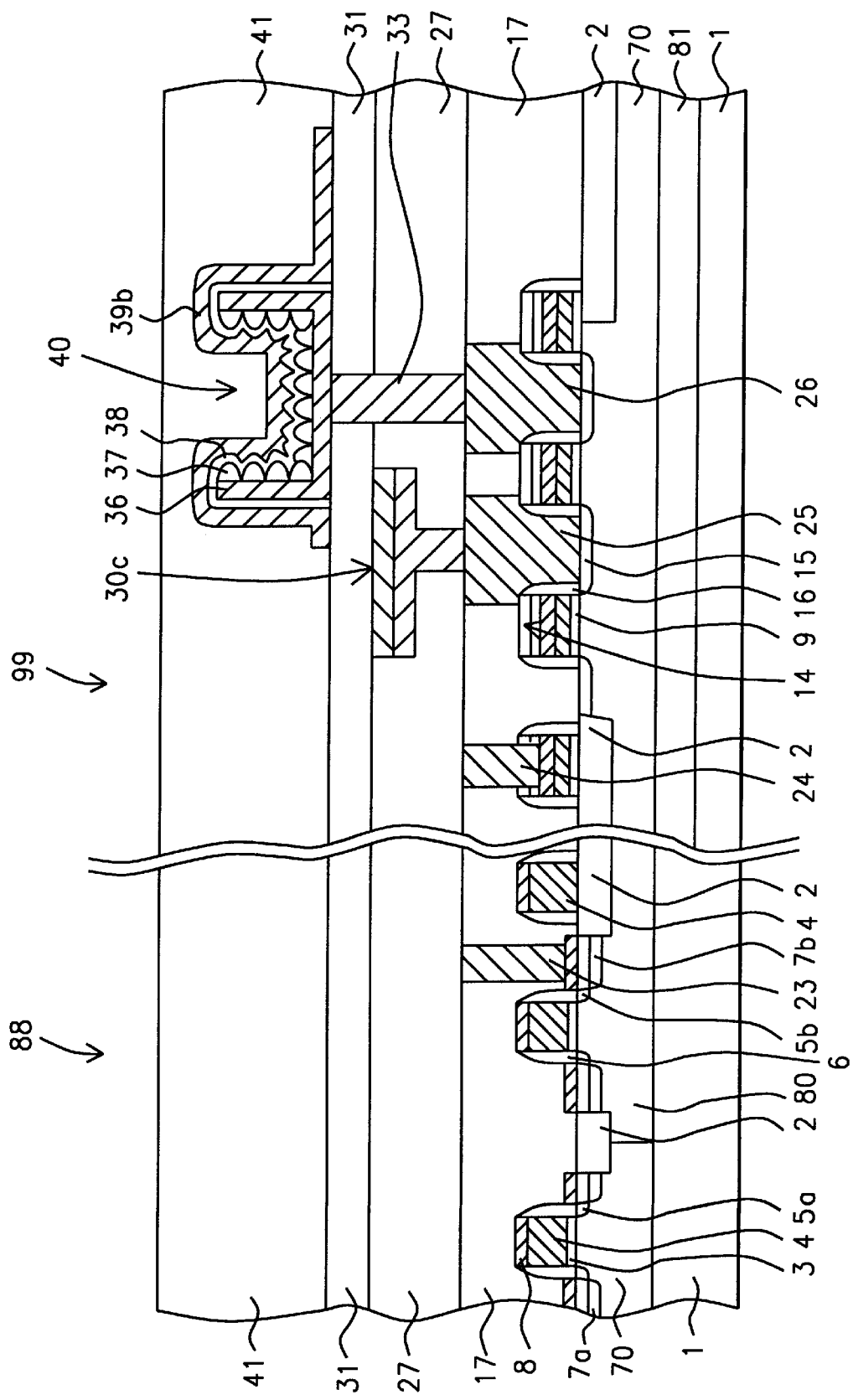

A photoresist shape, (not shown in drawings), is used as a mask to define the capacitor cell plate, via an anisotropic RIE procedure performed to polysilicon layer 39a, using $Cl_2$ as an etchant, and resulting in polysilicon top plate structure 39b. The resulting stacked capacitor structure 40, comprised of polysilicon top plate 39b, capacitor dielectric layer 38, and the crown shaped storage node structure, in turn comprised of HSG polysilicon layer 37, and polysilicon layer 36, is schematically shown in FIG. 16. Insulator layer 41, comprised of silicon oxide, or BPSG, is next deposited using LPCVD or PECVD procedures, to a thickness between about 8000 to 10000 Angstroms. A planarization procedure, performed, using a CMP procedure, is employed to create a smooth top surface topography for insulator layer 41, schematically shown in FIG. 16.

Figure 17:
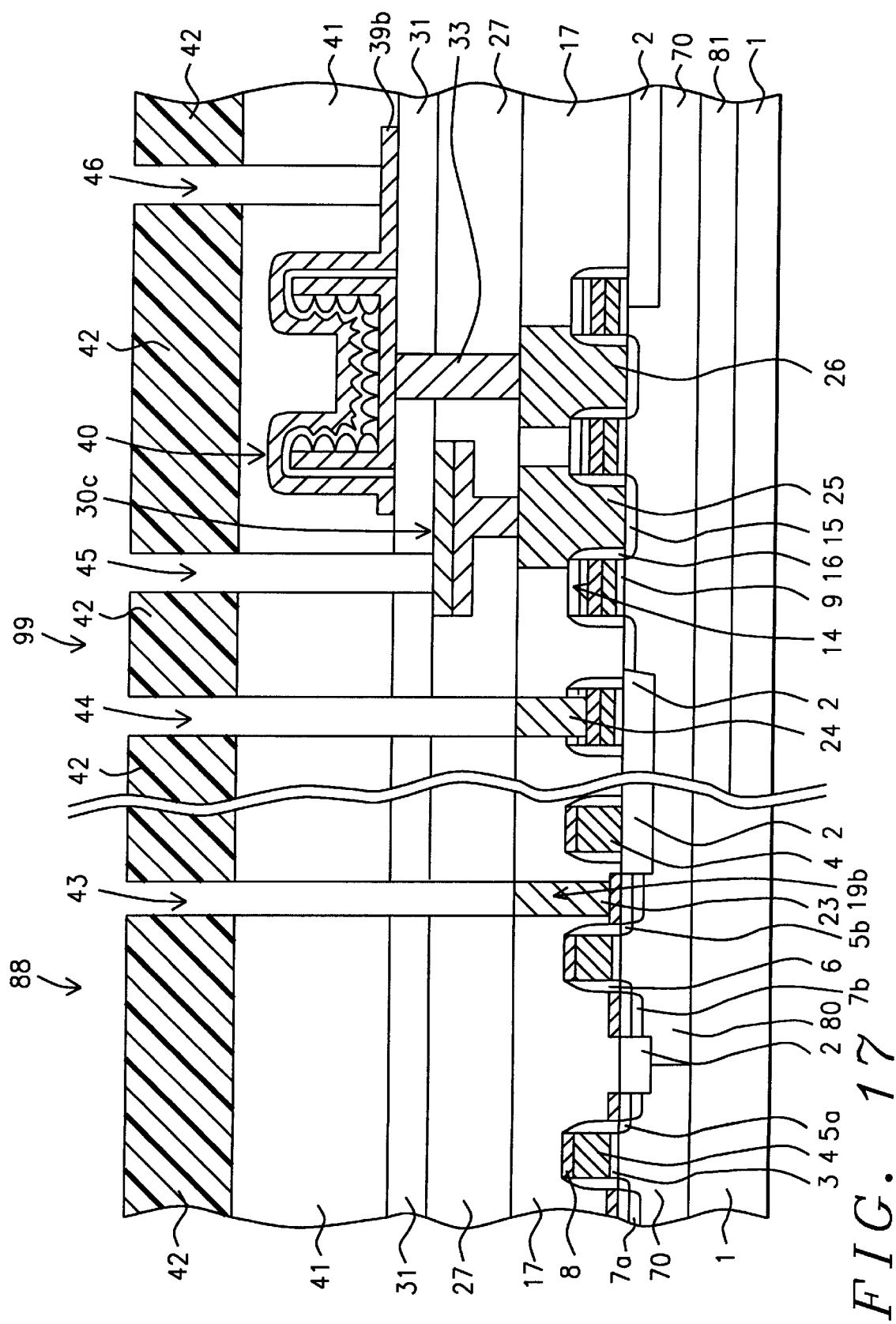

Photoresist shape 42, is next formed, and used as a mask to allow an anisotropic RIE procedure, using $CHF_3$ as an etchant, to create upper contact hole opening 43, in insulator layer 41, insulator layer 31, and insulator layer 27, exposing the top surface of tungsten structure 23, located in lower contact hole opening 19b. This is schematically shown in FIG. 17. The aspect ratio for upper contact hole opening 43, comprised with a diameter between about 0.25 to 0.35 um, is about 4 to 1. However if only a single stage opening was used to create the opening to this active device region, in logic region 88, the aspect ratio would be as high as 7 to 1. The same reduction in aspect ratio is experienced for upper contact hole opening 44, in insulator layer 41, insulator layer 31, and insulator layer 27, exposing the top surface of tungsten structure 24, in DRAM region 99. The anisotropic RIE procedure, using photoresist shape 42, as an etch mask, also creates opening 45, in insulator layer 41, and in insulator layer 31, exposing a portion of the top surface of polycide bitline structure 30c, as well as creating opening 46, in insulator layer 41, exposing a portion of the top surface of polysilicon top plate 39b. The result of these procedures is schematically shown in FIG. 17. If insulator layer 31, is a composite insulator layer, the anisotropic RIE procedure, used to create the upper contact holes, includes a $CF_4$ etch cycle, used to etch the silicon nitride component of the composite insulator layer.

Figure 18:
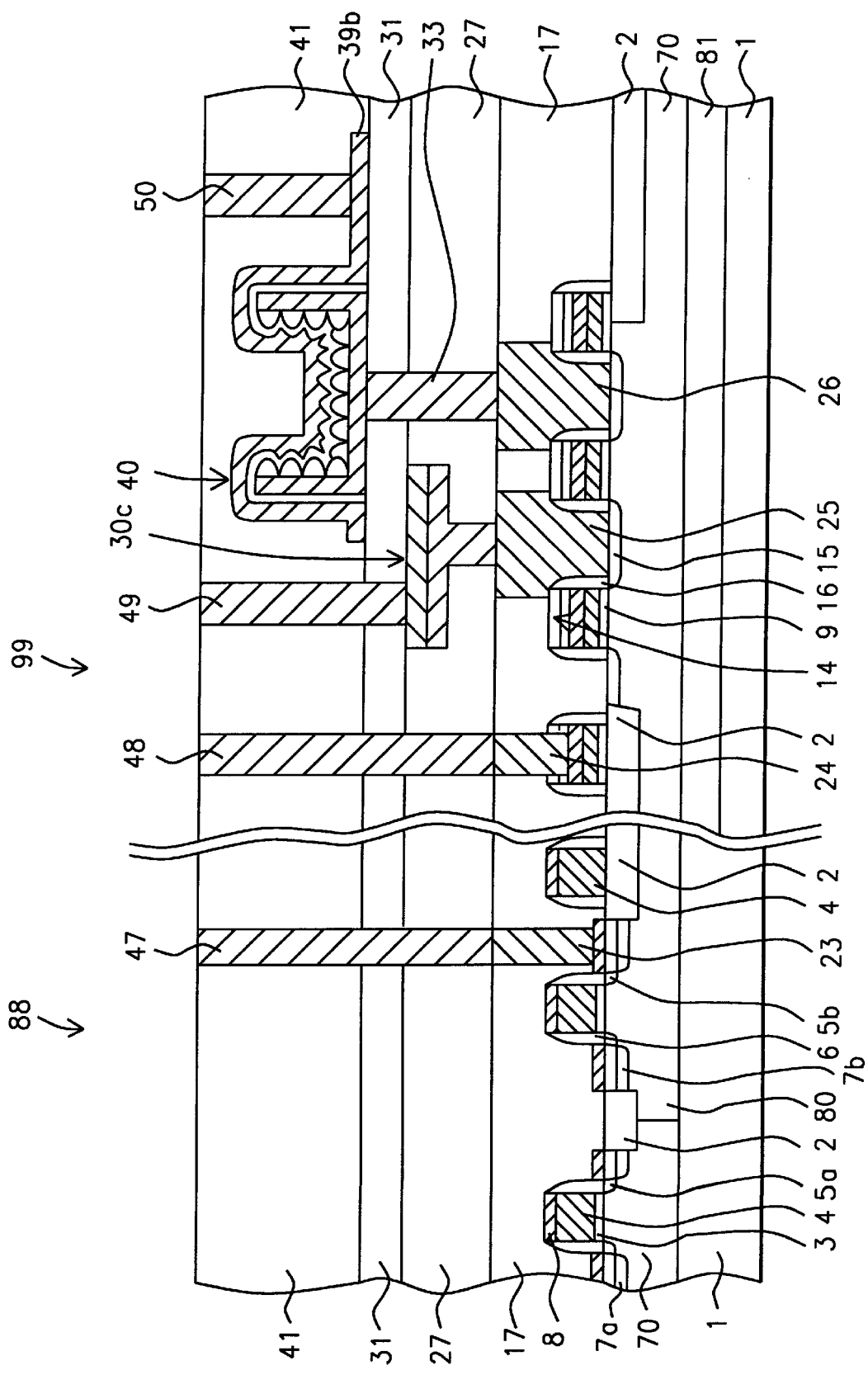

After removal of photoresist shape 42, again using plasma oxygen ashing and careful wet cleans, a tungsten layer is deposited, via LPCVD procedures, to a thickness between about 4000 to 6000 Angstroms, completely filling upper contact hole openings 43, 44, 45, and 46. Unwanted regions of the tungsten layer, residing on the top surface of insulator layer 41, are removed using either a selective RIE procedure, using $Cl_2$ as an etchant, or using a CMP procedure. The result of these procedures shown schematically in FIG. 18, are: upper tungsten structure 47, in upper contact hole opening, directly overlying tungsten structure 23, in logic region 88; upper tungsten structure 48, directly overlying tungsten structure 24, in DRAM memory region 99; upper tungsten structure 49, overlying and contacting polycide bitline structure 30*c*, and upper tungsten structure 50, overlying and contacting polysilicon top plate 39*b*.

The use of this invention allowed the aspect ratio for narrow diameter openings, to active device regions in logic region 88, to be reduced from about 7 to 1, to about 4 to 1. In addition this invention, using tungsten for the lower contact structures, allows the same material, tungsten, to be used for both SAC structures in the DRAM memory region, as well as for contact structures to the P type regions, in the logic region. If polysilicon were used for the SAC structures, in DRAM memory region 99, the possible diode formation, in P type regions, would negate the use of polysilicon in the P type logic regions, thus not allowing the aspect ratio reduction, accomplished using lower tungsten structures, in the logic region, to be realized.

A second iteration of this invention, allowing a reduction in the aspect ratio of contact holes to be achieved, is described using FIGS. 19–22. This iteration features the formation of the lower portion of the two stage contact hole opening, after formation of the DRAM capacitor structure, unlike the previously described first iteration, in which the lower portion of the two stage contact hole opening, was formed prior to formation of the DRAM capacitor structure.

Figure 19:
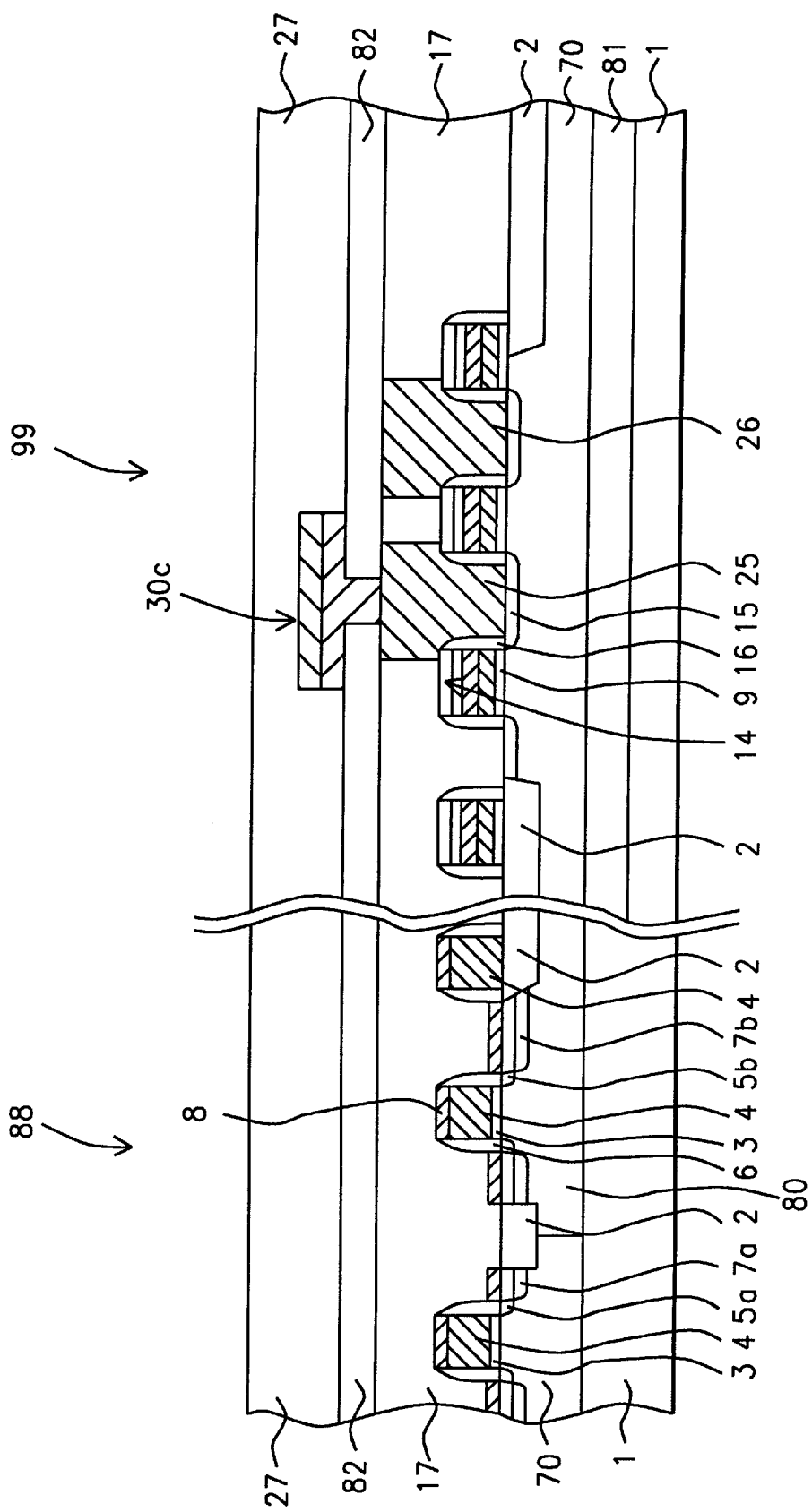
FIGS. 19–22, which schematically, in cross-sectional style, illustrates a second iteration of this invention, in which the lower portion of the two stage contact hole opening, is formed after formation of the DRAM capacitor structure.

FIG. 19, schematically shows the inclusion of insulator layer 82, comprised of silicon oxide, obtained via LPCVD or PECVD procedures, at a thickness between about 1000 to 3000 Angstroms, formed after formation of plug structures 25, and 26. Plug structures 25, and 26, can be either comprised of either metal, such as tungsten, or of doped polysilicon, in the DRAM region. After formation of a bit line structure 30*c*, contacting plug structure 25, insulator layer 27, obtained using conditions previously described, again is formed.

Figure 20:
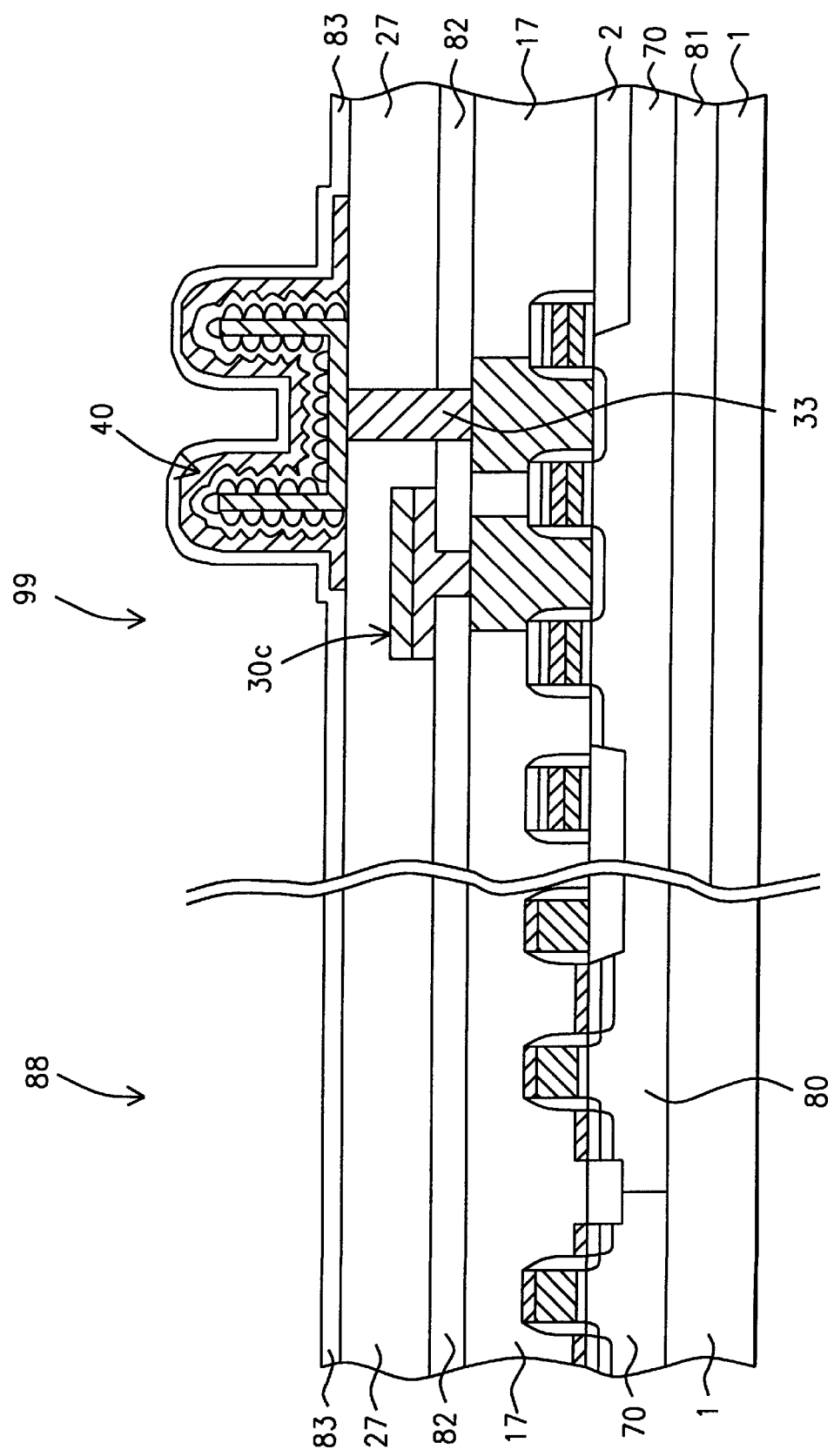

A storage node opening, and a DRAM capacitor structure 40, are next formed, again using materials and processes identical to the materials and processes previously used for the first iteration of this invention. A critical SiON layer 83, used as a bottom anti-reflective, (BARC), layer, is next deposited via PECVD procedures, to a thickness between about 200 to 1000 Angstroms. This is schematically shown in FIG. 20. If desired an organic BARC layer can be used in place of SiON layer 83.

Figure 21:
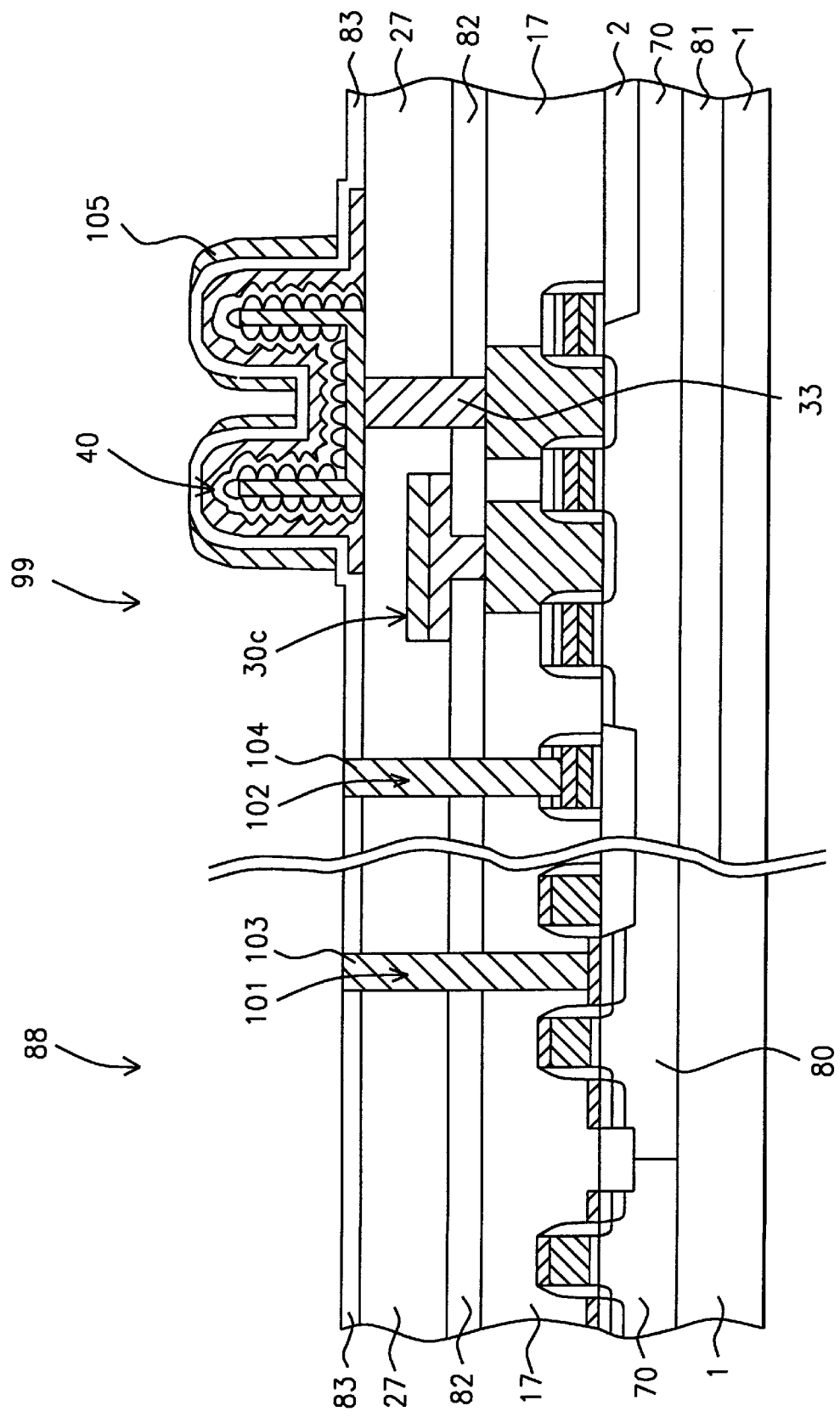

Photolithographic and anisotropic RIE procedures, are next used to create the lower portion of the two stage contact hole openings. FIG. 21, schematically shows lower opening 101, exposing an active device region, in logic region 88, while lower opening 102, exposes a conductive region in DRAM region 99. After removal of the photoresist shape used for definition of the lower contact hole openings, a metal deposition, comprised of an underlying adhesive-barrier layer, comprised of titanium—titanium nitride, and comprised of an overlying tungsten layer, is performed, completely filling the lower contact hole openings. A selective RIE procedure is next employed to remove unwanted regions of the metal layer, from the top surface of insulator SiON layer 83, resulting in lower metal contact structure 103, and lower metal contact structure 104, located in lower contact hole opening 101, and 102, respectfully. This is schematically shown in FIG. 21. Metal spacers 105, are also formed during the RIE procedure, on the sides of DRAM capacitor structure 40.

Figure 22:
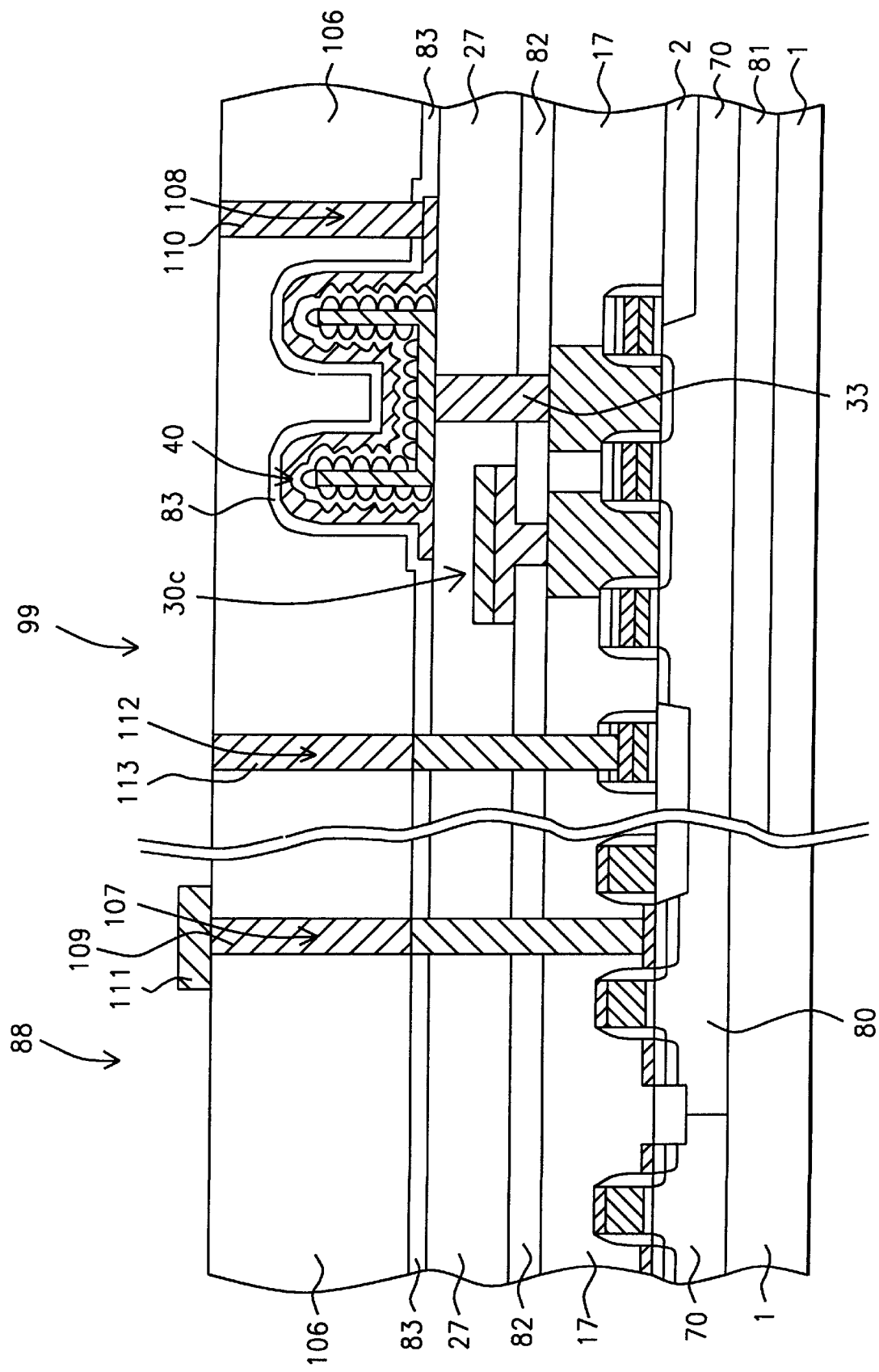

Insulator layer 106, comprised of silicon oxide, or BPSG, is next deposited via LPCVD or PECVD procedures, to a thickness between about 3000 to 6000 Angstroms. A chemical mechanical polishing procedure, is used for planarization purposes, resulting in a smooth top surface topography for insulator layer 106. Photolithographic and RIE procedures, are next used to form the upper portion openings, of the two stage contact hole openings. Openings 107, 108, and 113, expose a portion of the the top surface of lower metal contact structures, as well as exposing a portion of upper polysilicon electrode, of DRAM capacitor structure 40. After removal of the photoresist shape, used as a mask for creation of the upper portion openings, another deposition of titanium—titanium nitride, and tungsten, is performed, completely filling the upper portion openings. A chemical mechanical polishing procedure is then used to remove unwanted regions of the metal layer from the top surface of insulator layer 106, creating upper metal structures 109, 113, and 110, in the upper portion openings. This is schematically shown in FIG. 22. A metal interconnect structure ill, comprised of either an aluminum based layer, or a tungsten layer, is shown overlying and contacting the top surface of the metal structure, in the two stage contact hole opening.

While this invention has been particularly shown and described with reference to, the preferred embodiments thereof, it will be understood by those skilled in the art that various changes in form and details may be made without departing from the spirit and scope of this invention.

What is claimed is:

1. A method of forming metal filled, contact holes, in insulator layers, to regions of a semiconductor substrate used for logic devices, and to regions of said semiconductor substrate used for dynamic random access memory, (DRAM), devices, comprising the steps of:

forming polysilicon gate structures, on a first gate insulator layer, in a first region of said semiconductor substrate, used for said logic devices, with insulator spacers on the sides of said polysilicon gate structures;

forming heavily doped source/drain regions, in portions of said first region of said semiconductor substrate, not covered by said polysilicon gate structures, or by said insulator spacers;

forming self-aligned metal silicide layers on the top surface of said polysilicon gate structures, and on said heavily doped source/drain regions;

forming silicon nitride capped, polycide gate structures, on a second gate insulator layer, in a second region of said semiconductor substrate, used for said DRAM devices;

forming lightly doped source/drain regions, in portions of said second region of said semiconductor substrate, not covered by said silicon nitride capped, polycide gate structures;

forming silicon nitride spacers on the sides of said silicon nitride capped, polycide gate structures;

depositing a first insulator layer;

creating lower portion contact hole openings, in said first insulator layer: with a first lower portion contact hole, exposing a metal silicide layer, overlying a heavily doped source/drain region, in said first region of said semiconductor substrate; with a second lower portion contact hole, exposing the top surface of a polycide layer, located on a silicon nitride capped, polycide gate structure: with a third lower portion contact hole, located between, and self-aligned to, a first, and to a second, silicon nitride capped, polycide gate structure, exposing a first, lightly doped source/drain region, located between said first, and said second, silicon nitride capped, polycide gate structure; and with a fourth lower portion contact hole, located between, and self-aligned to, said second, and a third, silicon nitride capped, polycide gate structure, exposing a second, lightly doped source/drain region, exposed between said second, and said third, silicon nitride capped, polycide gate structures;

forming a first lower metal structure in said first lower portion contact hole, and forming a second lower metal structure in said second lower portion contact hole, while forming a first metal self-aligned contact, (SAC), structure, in said third, lower portion contact hole, and forming a second metal SAC structure, in said fourth, lower portion contact hole;

forming a dual damascene opening, in a second insulator layer, exposing a portion of the top surface of said first metal, SAC structure;

forming a bitline structure in said dual damascene opening;

forming a storage node contact hole, in a third insulator layer, and in said second insulator layer, exposing a portion of the top surface of said second metal, SAC structure;

forming a storage node contact structure in said storage node contact hole;

forming a capacitor opening in a fourth insulator layer, exposing the top surface of said storage node contact structure;

forming a crown shaped, storage node structure, on the exposed surfaces of said capacitor opening, in said fourth insulator layer, with said crown shaped, storage node structure comprised of vertical features, on the sides of said capacitor opening, and comprised of a horizontal feature, located at the bottom of said capacitor opening, overlying, and contacting the top surface of said storage node contact structure;

selectively removing said fourth insulator layer;

forming a capacitor dielectric layer on said crown shaped, storage node structure;

forming a capacitor top plate structure, on said capacitor dielectric layer, and on a portion of the top surface of said third insulator layer;

depositing a fifth insulator layer;

creating a first upper portion contact hole, in said fifth insulator layer, in said third insulator layer, and in said second insulator layer, exposing the top surface of said first lower metal structure; creating a second upper portion contact hole, in said fifth insulator layer, in said third insulator layer, and in said second insulator layer, exposing the top surface of said second lower metal structure; creating a third upper portion contact hole, in said fifth insulator layer, and in said third insulator layer, exposing a portion of the top surface of said bitline structure; and creating a fourth upper portion contact hole, in said fifth insulator layer, exposing a portion of the top surface of said capacitor top plate; and forming a first upper metal structure, in said first upper portion contact hole, overlying and contacting, said first lower metal structure; forming a second upper metal structure, in said second upper portion contact hole, overlying and contacting, said second lower metal structure; forming a third upper metal structure, in said third upper portion contact hole, overlying and contacting, the a portion of the top surface of said bitline structure; and forming a fourth upper metal structure, in said fourth upper portion contact hole, overlying and contacting, a portion of the top surface of said capacitor top plate.

2. The method of claim 1, wherein said first gate insulator layer, used for said logic devices, is a silicon dioxide layer, thermally grown in an oxygen-steam ambient, to a thickness between about 40 to 60 Angstroms.

3. The method of claim 1, wherein said second gate insulator layer, used for said DRAM devices, is a silicon dioxide layer, thermally grown in an oxygen-steam ambient, to a thickness between about 70 to 80 Angstroms.

4. The method of claim 1, wherein said first insulator layer is either a silicon oxide layer, or a borophosphosilicate layer, obtained via LPCVD or PECVD procedures, at a thickness between about 7000 to 10000 Angstroms, and planarized using a chemical mechanical polishing procedure.

5. The method of claim 1, wherein said first lower portion contact hole, and said second lower contact hole, are formed in said first insulator layer, with a diameter between about 0.25 to 0.35 um, via an anisotropic RIE procedure, using $CHF_3$ as an etchant.

6. The method of claim 1, wherein said third lower portion contact hole, and said fourth lower portion contact hole, are selectively opened, in said first insulator layer, via an anisotropic RIE procedure, using $CHF_3$ as an etchant, with said third lower portion contact hole, and said fourth lower portion contact hole, self-aligned to said silicon nitride capped, polycide gate structures.

7. The method of claim 1, wherein said first lower metal structure, said second lower metal structure, said first metal SAC structure, and said second metal SAC structure, are comprised of tungsten, formed from a tungsten layer obtained via LPCVD procedures, at a thickness between about 3000 to 6000 Angstroms.

8. The method of claim 1, wherein said second insulator layer is either a silicon oxide layer, or a borophosphosilicate layer, obtained via LPCVD or PECVD procedures, at a thickness between about 3000 to 4000 Angstroms.

9. The method of claim 1, wherein said bitline structure, is a polycide structure, comprised of: an underlying polysilicon layer, obtained via LPCVD procedures, at a thickness between about 1000 to 2000 Angstroms, and doped in situ, during deposition via the addition of arsine, or phosphine, to a silane ambient; and an overlying tungsten silicide layer, obtained via LPCVD procedures, at a thickness between about 1000 to 2000 Angstroms.

10. The method of claim 1, wherein said third insulator layer is a composite insulator layer, at a thickness between about 1500 to 2500 Angstroms, comprised of an underlying silicon oxide layer, obtained via LPCVD or PECVD procedures, and an overlying silicon nitride layer, obtained via LPCVD or PECVD procedures.

11. The method of claim 1, wherein said fourth insulator layer is a silicon oxide layer, obtained via LPCVD or PECVD procedures, at a thickness between about 4000 to 6000 Angstroms.

12. The method of claim 1, wherein said crown shaped, storage node structure, is comprised of a hemispherical grain silicon, on underlying polysilicon.

13. The method of claim 1, wherein said fourth insulator layer is selectively removed using a buffered hydrofluoric acid solution.

14. The method of claim 1, wherein said fifth insulator layer is a silicon oxide layer, or a borophosphosilicate layer, obtained via LPCVD or PECVD procedures, at a thickness between about 8000 to 10000 Angstroms.

15. The method of claim 1, wherein said first upper portion contact hole, and said second upper portion contact hole, are formed in said fifth insulator layer, in said third insulator layer, and in said second insulator layer, featuring a diameter between about 0.25 to 0.35 um, via an anisotropic RIE procedure.

16. The method of claim 1, wherein said first upper metal structure, said second upper metal structure, said third upper metal structure, and said fourth upper metal structure, are comprised of tungsten, formed from a tungsten layer, obtained via LPCVD procedures, at a thickness between about 4000 to 6000 Angstroms.

17. A method of fabricating narrow diameter contact holes, in thick insulator layers, for logic devices, and for DRAM memory devices, on a semiconductor substrate, using a two stage contact hole opening procedure, and a two stage metal fill procedure, to reduce the aspect ratio of the narrow diameter contact holes, in which the lower portion opening, of said two stage contact hole opening procedure, is performed after the formation of a capacitor structure, comprising the steps of:

forming polysilicon gate structures, on a first silicon dioxide gate insulator layer, in a first region of said semiconductor substrate to be used for said logic devices;

forming lightly doped source/drain regions, in an area of said first region, of said semiconductor substrate, not covered by said polysilicon gate structures;

forming insulator spacers on the sides of said polysilicon gate structures;

forming heavily doped source/drain regions, in an area of said first region, of said semiconductor substrate, not covered by said polysilicon gate structures, or by said insulator spacers;

forming a titanium silicide layer on the top surfaces of said polysilicon gate structures, and on the top surfaces of said heavily doped source/drain regions;

forming silicon nitride capped, polycide gate structures, on a second silicon dioxide gate insulator layer, in a second region of semiconductor substrate, to be used for said DRAM memory devices;

forming lightly doped source/drain regions, in an area of said second region, of said semiconductor substrate, not covered by said silicon nitride capped, polycide gate structures;

forming silicon nitride spacers on the sides of said silicon nitride capped, polycide gate structures;

depositing a first insulator layer;

performing a chemical mechanical polishing procedure to form a planarized first insulator layer;

performing an anisotropic RIE procedure, to create: a first, narrow diameter, lower contact hole, in said planarized first insulator layer, exposing a portion of the top surface of a titanium silicide layer, overlying a heavily doped source/drain region; a second, narrow diameter, lower contact hole, in said planarized first insulator layer, and in the silicon nitride, and silicon oxide layers, of a silicon nitride capped, polycide gate structure, exposing a portion of the top surface of a metal silicide component, of a silicon nitride capped, polycide gate structure; a first SAC opening, in said planarized first insulator layer, located between a first, and a second, silicon nitride capped, polycide gate structure, exposing a first lightly doped source/drain region; and a second SAC opening, in said planarized first insulator layer, located between said second, and a third, silicon nitride capped, polycide gate structure, exposing a second lightly doped source/drain region;

depositing a first tungsten layer;

removing said first tungsten layer, from the top surface of said planarized first insulator layer, creating: a first lower tungsten structure, in said first, narrow diameter, contact hole; a second lower tungsten structure, in said second, narrow diameter, contact hole; a first tungsten SAC structure, in said first SAC opening; and a second tungsten SAC structure, in said second SAC opening;

depositing a second insulator layer;

forming a dual damascene opening, in said second insulator layer, exposing a portion of the top surface of said first tungsten SAC structure;

forming a polycide bitline structure, in said dual damascene opening;

depositing a composite insulator layer, comprised of an overlying silicon nitride layer, and an underlying silicon oxide layer;

forming a storage node opening, in said composite insulator layer, and in said second insulator layer, exposing a portion of the top surface of said second tungsten SAC structure;

forming a polysilicon storage node contact structure, in said storage node opening;

depositing a disposable, silicon oxide layer;

forming a capacitor opening in said disposable, silicon oxide layer, exposing the top surface of said polysilicon storage node contact structure, at the bottom of said capacitor opening;

depositing a first polysilicon layer;

performing a chemical mechanical polishing procedure, removing said first polysilicon layer from the top surface of said disposable, silicon oxide layer, and creating a polysilicon, crown shaped structure, comprised of vertical polysilicon feature, on the sides of said capacitor structure, and comprised of a horizontal polysilicon feature, located at the bottom of said capacitor opening, overlying and contacting, said polysilicon storage node contact structure;

forming a hemispherical grain silicon layer on said polysilicon, crown shaped structure, creating a crown shaped, storage node structure, comprised of said hemispherical grain silicon, on said polysilicon, crown shaped structure;

selectively removing said disposable, silicon oxide layer, from the top surface of said composite insulator layer;

forming a capacitor dielectric layer, on said crown shaped, storage node structure;

depositing a second polysilicon layer;

patterning of said second polysilicon layer to create a polysilicon top plate, overlying said capacitor dielectric layer, and overlying a portion of the top surface of said composite insulator layer;

depositing a third insulator layer;

performing a chemical mechanical polishing procedure to create a planarized third insulator layer;

performing an anisotropic RIE procedure, to create: a first, narrow diameter, upper contact hole, in said planarized third insulator layer, in said composite insulator layer, and in said second insulator layer, exposing the top surface of said first lower tungsten structure; a second, narrow diameter, upper contact hole, in said planarized third insulator layer, in said composite insulator layer, and in said second insulator layer, exposing the top surface of said second lower tungsten structure; a third, narrow diameter, upper contact hole, in said planarized third insulator layer, and in said composite insulator layer, exposing a portion of the top surface of said polycide bitline structure; and a fourth, narrow diameter, upper contact hole, in said planarized third insulator layer, exposing a portion of the top surface of said polysilicon top plate, in a region in which said polysilicon top plate resides on the top surface of said composite insulator layer;

depositing a second tungsten layer; and performing a chemical mechanical polishing procedure, to remove said second tungsten layer from the top surface of said planarized third insulator layer, creating: a first upper tungsten structure, in said first, narrow diameter, upper contact hole, overlying and contacting, said first lower tungsten structure; a second upper tungsten structure, in said second, narrow diameter, upper contact hole, overlying and contacting, said second lower tungsten structure; a third upper tungsten structure, in said third, narrow diameter, upper contact hole, overlying and contacting, a portion of the top surface of said polycide bitline structure; and a fourth upper tungsten structure, in said fourth, narrow diameter, upper contact hole, overlying and contacting, a portion of the top surface of said polysilicon top plate.

18. The method of claim 17, wherein said first silicon dioxide gate insulator layer is thermally grown in an oxygen-steam ambient, to a thickness between about 40 to 60 Angstroms.

19. The method of claim 17, wherein said second silicon dioxide gate insulator layer is thermally grown in an oxygen-steam ambient, to a thickness between about 70 to 80 Angstroms.

20. The method of claim 17, wherein said planarized first insulator layer, is a silicon oxide layer, or a borophosphosilicate layer, obtained via LPCVD or PECVD procedures, at a thickness between about 7000 to 10000 Angstroms, then planarized using a chemical mechanical polishing procedure.

21. The method of claim 17, wherein said first, narrow diameter, lower contact hole, and said second, narrow diameter, lower contact hole, with diameters between about 0.25 to 0.35 um, are formed in said planarized first insulator layer, via an anisotropic RIE procedure, using $CHF_3$ as an etchant.

22. The method of claim 17, wherein said first lower tungsten structure, and said second lower tungsten structure, are formed from said first tungsten layer, obtained via LPCVD procedures, at a thickness between about 2000 to 6000 Angstroms.

23. The method of claim 17, wherein said second insulator layer is either a silicon oxide layer, or a borophosphosilicate layer, obtained via LPCVD or PECVD procedures, at a thickness between about 3000 to 4000 Angstroms.

24. The method of claim 17, wherein said composite insulator layer, is obtained via LPCVD or PECVD procedures, at a thickness between about 1500 to 2500 Angstroms, comprised of an overlying silicon nitride layer, and an underlying silicon oxide layer.

25. The method of claim 17, wherein said disposable, silicon oxide layer, is obtained via LPCVD or PECVD procedures, at a thickness between about 4000 to 6000 Angstroms.

26. The method of claim 17, wherein said disposable silicon oxide layer is selectively removed using a buffered hydrofluoric acid solution.

27. The method of claim 17, wherein said third insulator layer is a silicon oxide layer, or a borosilicate layer, obtained via LPCVD or PECVD procedures, at a thickness between about 8000 to 10000 Angstroms.

28. The method of claim 17, wherein said first, narrow diameter, upper contact hole, and said second, narrow diameter, upper contact hole, with diameters between about 0.25 to 0.35 um, are formed via an anisotropic RIE procedure.

29. The method of claim 17, wherein said first upper tungsten structure, and said second upper tungsten structure, are formed from said second tungsten layer, obtained via LPCVD procedures, at a thickness between about 4000 to 6000 Angstroms.

30. A method of forming a two stage contact hole opening, to logic devices, and to memory devices, on a semiconductor substrate, with a lower portion of said two stage contact hole opening formed after the formation of a capacitor structure, in said memory region, comprising the steps of:

forming conductive plugs in a first insulator layer, overlying and contacting active device regions in said memory region, of said semiconductor substrate;

forming a bit line structure, on a second insulator layer, contacting a first conductive plug, exposed in an opening in said second insulator layer, in said memory region, of said semiconductor substrate;

forming a capacitor structure in a third insulator layer, contacting a second conductive plug, exposed in an opening in said third insulator layer, and in said second insulator layer, in said memory region, of said semiconductor substrate;

depositing a bottom anti-reflective layer;

forming a lower portion contact hole, in said bottom anti-reflective layer, in said third insulator layer, in said second insulator layer, and in said first insulator layer, exposing a portion of an active device region, in a logic region, of said semiconductor substrate;

forming a lower metal plug structure, in said lower portion contact hole;

depositing a fifth insulator layer;

forming an upper portion contact contact hole, exposing a portion of the top surface of said lower metal plug structure; and forming an upper metal plug structure, in said upper portion contact hole.

31. The method of claim 30, wherein said bottom anti-reflective layer is a SiON layer, obtained via PECVD procedures, at a thickness between about 200 to 1000 Angstroms.

32. The method of claim 30, wherein said bottom anti-reflective layer is an organic layer, obtained via coating procedures, at a thickness between about 500 to 1500 Angstroms.

* * * * *